(12) United States Patent
Lin

(10) Patent No.: US 11,538,832 B2
(45) Date of Patent: Dec. 27, 2022

(54) SEMICONDUCTOR MEMORY STRUCTURE AND METHOD OF MANUFACTURING THE SAME

(71) Applicant: TAIWAN SEMICONDUCTOR MANUFACTURING COMPANY LTD., Hsinchu (TW)

(72) Inventor: Meng-Han Lin, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 157 days.

(21) Appl. No.: 17/142,152

(22) Filed: Jan. 5, 2021

(65) Prior Publication Data

US 2022/0216236 A1 Jul. 7, 2022

(51) Int. Cl.
*H01L 27/11597* (2017.01)
*H01L 23/528* (2006.01)
*H01L 23/522* (2006.01)
*H01L 27/1159* (2017.01)

(52) U.S. Cl.
CPC .... *H01L 27/11597* (2013.01); *H01L 23/5226* (2013.01); *H01L 23/5283* (2013.01); *H01L 27/1159* (2013.01)

(58) Field of Classification Search
CPC ........... H01L 27/11597; H01L 23/5226; H01L 23/5283; H01L 27/1159
See application file for complete search history.

(56) References Cited

U.S. PATENT DOCUMENTS

2017/0179154 A1* 6/2017 Furihata ............ H01L 27/11575
2021/0335802 A1* 10/2021 Lee ................... H01L 21/28525

* cited by examiner

*Primary Examiner* — Karen Kusumakar
(74) *Attorney, Agent, or Firm* — WPAT; Anthony King

(57) ABSTRACT

A semiconductor memory structure and method of manufacturing a semiconductor memory structure are provided. The semiconductor memory structure comprises a cell array region, at least one connection region formed beside the cell array region and an interconnect structure formed on the connection region. The connection region comprises staircase portions and interval portions, which are alternately arranged and are separated by ferroelectric layers. The staircase portion comprises a staircase structure of alternating insulating layers and conductive layers, a dielectric layer formed on the staircase structure, and first conductive pillars formed over the staircase structure, extending into the dielectric layer and in contact with the staircase structure. The interval portion is formed beside the staircase portion and comprises second conductive pillars. The interconnect structure comprises vias formed on the first conductive pillars and the second conductive pillars in a XY staggered pattern.

20 Claims, 23 Drawing Sheets

SEMICONDUCTOR MEMORY STRUCTURE AND METHOD OF MANUFACTURING THE SAME

BACKGROUND

Many modern-day electronic devices include non-volatile memory. Non-volatile memory is electronic memory that is able to store data in the absence of power. A promising candidate for the next generation of non-volatile memory is ferroelectric random-access memory (FeRAM). FeRAM has a relatively simple structure and is compatible with complementary metal-oxide-semiconductor (CMOS) logic fabrication processes.

BRIEF DESCRIPTION OF THE DRAWINGS

Aspects of the present disclosure are best understood from the following detailed description when read with the accompanying Figures. It is emphasized that, in accordance with the standard practice in the industry, various features are not drawn to scale. In fact, the dimensions of the various features may be arbitrarily increased or reduced for clarity of discussion.

DETAILED DESCRIPTION OF THE DISCLOSURE

Figure 1:
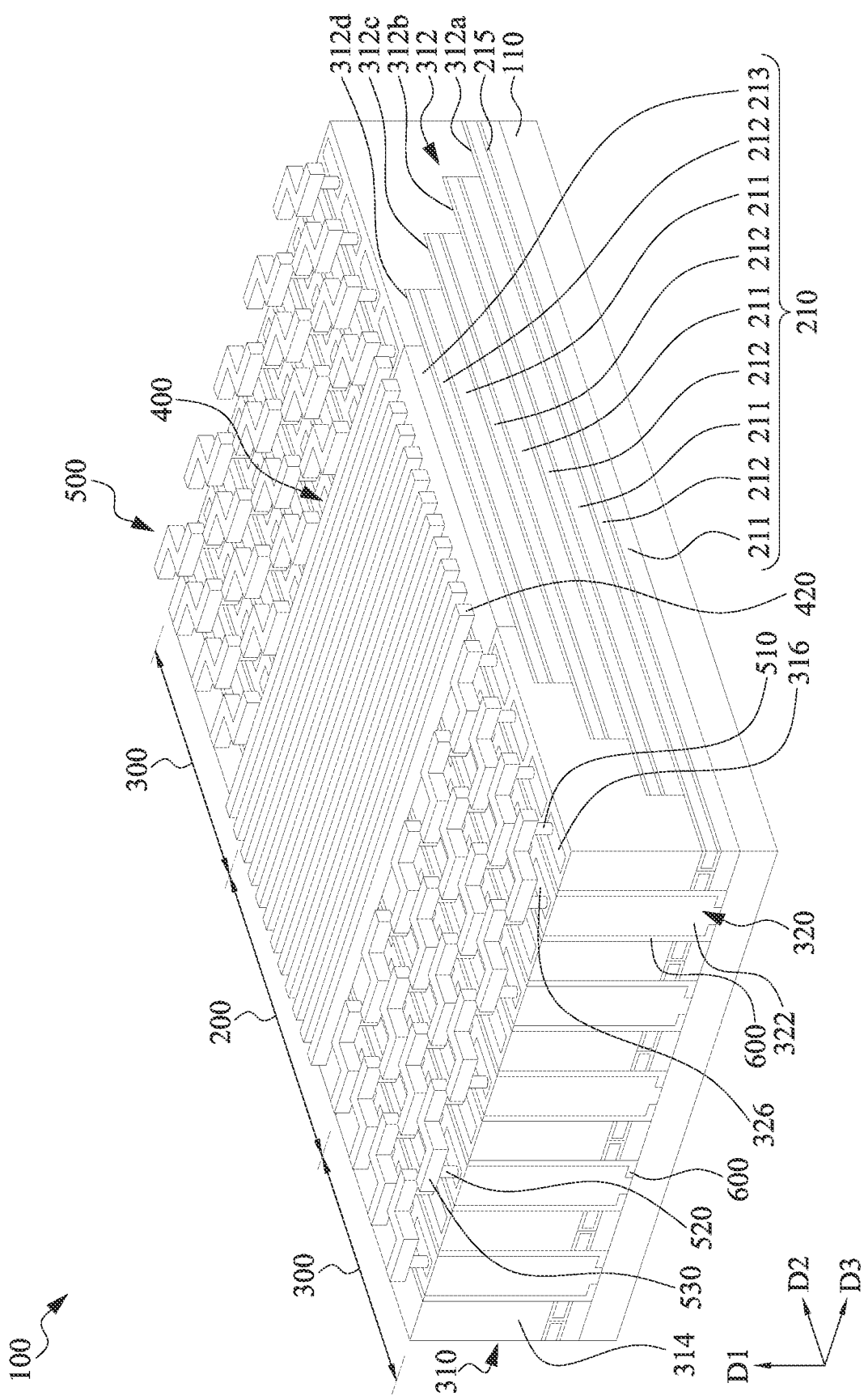
FIG. 1 is a schematic perspective view illustrating a semiconductor memory structure in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper," "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 100 degrees or at other orientations) and the spatially relative descriptors used herein may likewise be interpreted accordingly.

As used herein, the terms such as "first," "second" and "third" describe various elements, components, regions, layers and/or sections, but these elements, components, regions, layers and/or sections should not be limited by these terms. These terms may be only used to distinguish one element, component, region, layer or section from another. The terms such as "first," "second" and "third" when used herein do not imply a sequence or order unless clearly indicated by the context.

Many modern day electronic devices contain electronic memory configured to store data. Electronic memory may be volatile memory or non-volatile memory. Volatile memory stores data when power is on, while non-volatile memory (NVM) is able to store data when power is off. For example, ferroelectric random-access memory (FeRAM) devices are one promising candidate for a next generation NVM technology. This is because FeRAM devices provide many advantages, including fast write time, high endurance, low power consumption, and low susceptibility to damage from radiation. NVM technology uses memory cells that are located within a back-end-of-the-line (BEOL) of an integrated chip (e.g., located between metal interconnect layers overlying a semiconductor substrate). The memory cells are stacked into multiple layers to create a 3D structure.

Since semiconductor memory devices are continually shrinking in size, a high-density interconnect structure is needed to achieve better performance. A semiconductor memory device comprises a cell array region, peripheral regions and interconnect structures formed on the cell array region and peripheral regions. Generally, a plurality of vias are formed on the peripheral region so as to build the interconnect structure. Due to short distance between vias in the peripheral regions, two or more masks are required to define vias in the same level. Using more masks increases costs and requires more operations for manufacturing semiconductor memory devices. Therefore, forming an interconnect structure on the peripheral region for semiconductor memory devices is so far a time-consuming and costly task. There is a need to find a strategy to simplify the manufacturing of the interconnect structure and reduce cost.

The present disclosure relates to a design of 3D nonvolatile memory structures for enhancing the switching performance and read speed. In some embodiments, the provided structure can be applied to FeRAM and extendable to other memories such as flash, resistive random access memory (RRAM), magnetic random access memory (MRAM) with decent process and structure modifications. Accordingly, a stable type of 3D stackable nonvolatile memory devices can be formed, so that the device property can be enhanced.

Figure 4A:
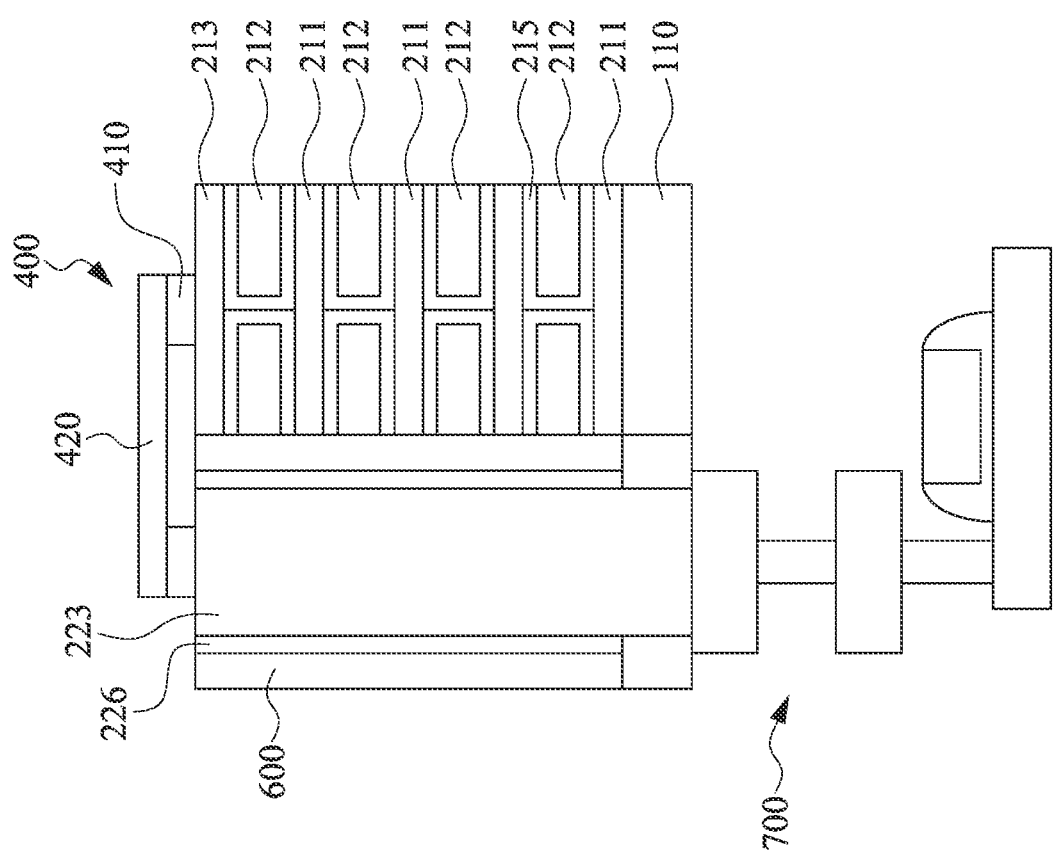
FIG. 4A is a side view of a portion of the cell array region of the semiconductor memory structure according to the present disclosure in connection with a memory device.
Figure 4B:
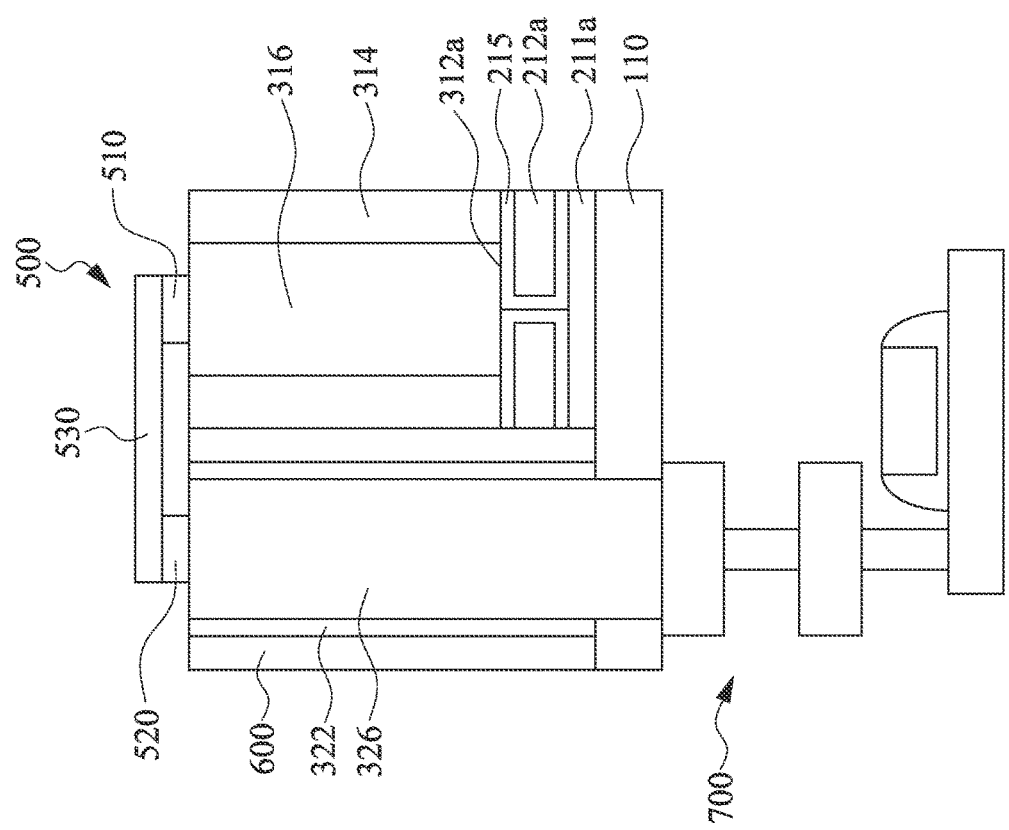
FIG. 4B is a side view of a portion of the connection region of the semiconductor memory structure according to the present disclosure in connection with a memory device.

FIG. 1 is a schematic drawing illustrating a semiconductor memory structure 100 in accordance with one or more embodiments of the present disclosure. The semiconductor memory structure 100 includes a cell array region 200 sandwiched by two connection regions 300, a plurality of first interconnect structures 400 and a plurality of second interconnect structures 500. The cell array region 200 and two connection regions 300 are disposed on a substrate 110. In some embodiments, the substrate 110 is a silicon substrate. Alternatively or additionally, the substrate 110 includes germanium, an alloy semiconductor (for example, SiGe), another suitable semiconductor material, or a combination thereof. Alternatively, the substrate 110 is a semiconductor-on-insulator substrate, such as a silicon-on-insulator (SOI) substrate, a silicon germanium-on-insulator (SGOI) substrate, or a germanium-on-insulator (GOI) substrate. Semiconductor-on-insulator substrates can be fabricated using separation by implantation of oxygen (SIMOX), wafer bonding, and/or other suitable methods. In some embodiments, the substrate 110 can include various devices, such as CMOS devices. For example, the substrate 110 can include memory devices, such as CMOS devices under array (CUA) (as shown in FIGS. 4A and 4B), but the disclosure is not limited thereto.

Figure 2:
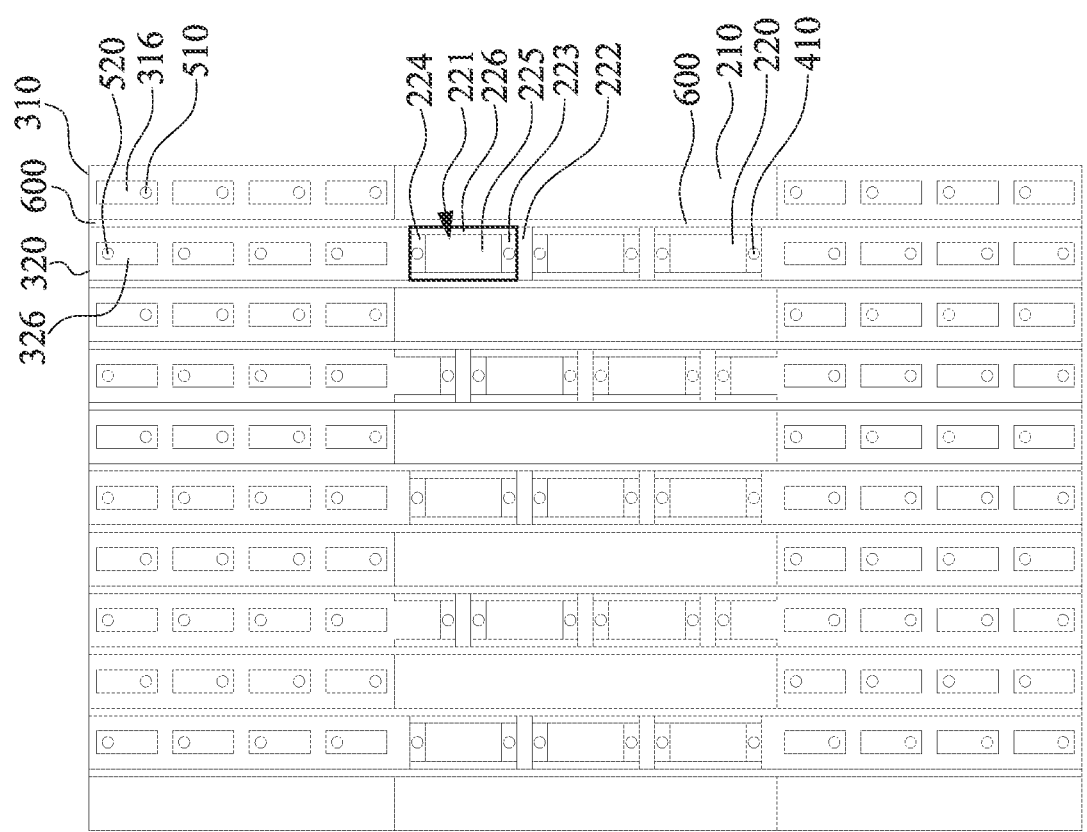
FIG. 2 is a top view of a portion of the semiconductor memory structure of FIG. 1 according to the present disclosure.

With further reference to FIG. 2, which is a top view of a portion of the semiconductor memory structure of FIG. 1 according to the present disclosure. It should be noted that portions of the first interconnect structures 400 and portions of the second interconnect structures 500 (i.e., the metal layers of the first and second interconnect structures 400 and 500) are omitted from FIG. 2 for clarity. The cell array region 200 includes a plurality of stacking portions 210 and a plurality of cell portions 220. Each stacking portion 210 and adjacent cell portions 220 can be separated by ferroelectric layers 600. In some embodiments, the stacking portion 210 can be formed on the substrate 110 and includes a plurality of insulating layers 211, a plurality of conductive layers 212 and a topmost insulating layer 213 stacking along a first direction D1. The insulating layers 211 and the conductive layers 212 are alternately arranged and the topmost layer 213 is used to define the location of the cell array region 200. The number of the alternating layers included in the stacking portion 210 can be as great as the number of layers needed for the semiconductor memory structure. In some embodiments, the stacking portions 210 extend along a second direction D2 and are arranged along a third direction D3. In some embodiments, the second direction D2 and the third direction D3 are perpendicular to each other. Further, in some embodiments, the topmost insulating layer 213 and the bottommost layer can both include insulating materials, but the disclosure is not limited thereto. Thicknesses of the insulating layers 211, thicknesses of the conductive layer 212 and thicknesses of the topmost insulating layer 213 can be similar or different, depending on different product requirements. In some embodiments, the insulating layers 211 include an insulating material, such as silicon oxide, but the disclosure is not limited thereto. In some embodiments, the conductive layer 212 may include metals, but the disclosure is not limited thereto. In some embodiments, the conductive layers 212 correspond to word lines (WL).

In some embodiments, each conductive layer 212 may be separated into two sublayers by glue layers 215. Each glue layer 215 partially surrounds one sublayer so as to not only separate two adjacent sublayers from each other, but also separate the conductive layer 212 from the adjacent insulating layers 211. Each glue layer 215 may have a U shape, V shape, W shape and so on, but the disclosure is not limited thereto. In some embodiments, the glue layer 215 may include oxides, such as $Al_2O_3$. The glue layer 215 can be used to improve adhesion of the metal portion in the stacking portion 210.

The cell portions 220 in the cell array region 200 can be formed over the substrate 110 and extend along the second direction D2. Each cell portion 220 can be sandwiched by the stacking portions 210, so that the cell portions 220 and the stacking portions 210 are alternately arranged along the third direction D3. In some embodiments, each cell portion 220 comprises a plurality of cell strings 221, which are separated by cell isolation structure 222. In some embodiments, each cell string 221 comprises a first conductive structure 223, a second conductive structure 224, a channel isolation structure 225 and two semiconductor layers 226.

Figure 3:
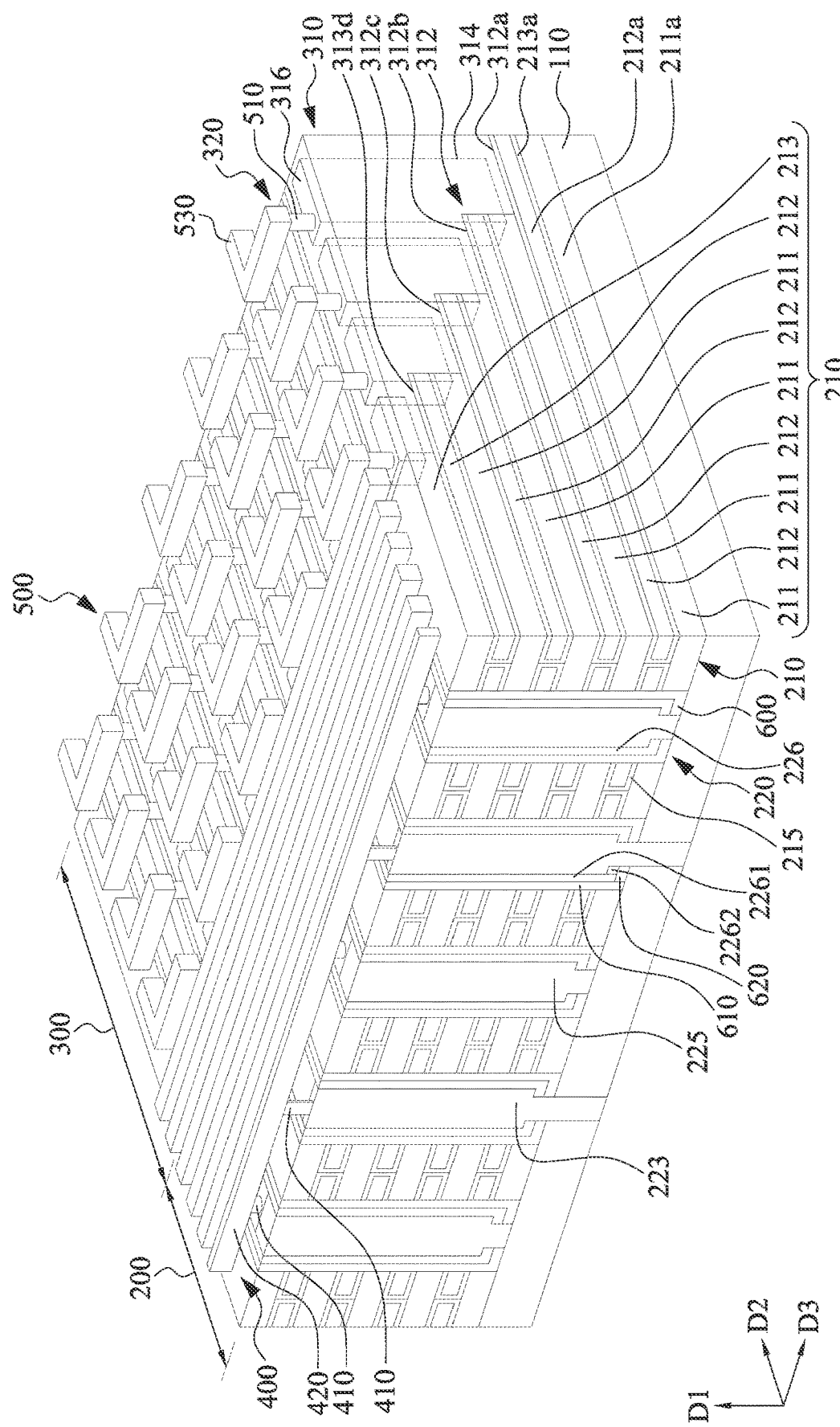
FIG. 3 is a perspective view of a portion of the semiconductor memory structure of FIG. 1 according to the present disclosure.

In some embodiments, as shown in FIG. 3, the first conductive structure 223 and the second conductive structure 224 independently penetrate through the cell array region 200 along the first direction D1 to contact the substrate 110. In some embodiments, as shown in FIG. 4A, the first conductive structure 223 and/or the second conductive structure 224 independently penetrate through not only the cell array region 200, but also the substrate 110 to couple to memory devices 700 (such as, CUA). The first conductive structure 223 and the second conductive structure 224 are formed in a column shape, e.g., flat column or rectangular column shape, extending in the cell array region 200 along the first direction D1. In some embodiments, the first conductive structure 223 corresponds to source structures and the second conductive structure 224 corresponds to drain structures. In some embodiments, the first conductive structures 223 correspond to drain structures and the second conductive structures 224 correspond to source structures. In some embodiments, the first conductive structure 223 and the second conductive structure 224 can independently include various conductive materials, e.g., metal such as aluminum (Al), titanium (Ti), cobalt (Co), silver (Ag), gold (Au), copper (Cu), nickel (Ni), chromium (Cr), hafnium (Hf), rhodium (Ru), tungsten (W), platinum (Pt) and/or alloys thereof, or a metal nitride such as titanium nitride (TiN), tantalum nitride (TaN), or the like, but is not limited thereto.

In some embodiments, the channel isolation structure 225 may be disposed between the semiconductor layers 226 and electrically isolates the first conductive structure 223 and the second conductive structure 224. The channel isolation structure 225 may include dielectric materials, including oxides, nitrides and the like, such as silicon oxide, silicon nitride, SiCN, $Al_2O_3$, $HfO_2$, SiON, and $La_2O_3$, but is not limited to the above-mentioned materials. The semiconductor layers 226 may be formed along the ferroelectric layers 600, so that the first conductive structure 223, the second conductive structure 224 and the channel isolation structure 225 can be separated from the ferroelectric layers 600 through the semiconductor layer 226. In some embodiments, the semiconductor layers 226 may include a semiconductor material. In some embodiments, the semiconductor layers 226 may serve as channel. In view of FIG. 3, each semiconductor layer 226 has an L-shaped vertical cross section and comprises a longitudinal portion 2261 and a horizontal portion 2262. In some embodiments, the semiconductor layers 226 may include various materials, such as an amorphous silicon (a-Si) material, a polycrystalline silicon (poly-Si) material, an oxide semiconductor material (e.g., indium zinc oxide (IZO), indium-gallium-zinc oxide (IGZO), indium tungsten oxide (IWO), indium tin oxide (ITO), zinc oxide (ZnO), stannous oxide (SnO), and copper oxide (CuO)), or the like, but is not limited to the above-mentioned materials.

The cell isolation structures 222 separate the cells strings 221 from each other. In some embodiments, the cell isolation structures 222 may be arranged in an array configuration or a staggered array configuration. In some embodiments, the cell isolation structures 222 penetrate through the cell array region 200 and contact the substrate 110. In some embodiments, the cell isolation structures 222 may include dielectric materials, including oxides, nitrides and the like, such as silicon oxide, silicon nitride, SiCN, $Al_2O_3$, $HfO_{20}$, SiON, and $La_2O_3$, but is not limited to the above-mentioned materials.

The ferroelectric layer 600 can be formed between the stacking portion 210 and the cell portions 220. In some embodiments, the ferroelectric layer 600 penetrates through the cell array region 200 along the first direction D1 and is in contact with the substrate 110. As mentioned above, the conductive layers 212 may correspond to word lines. In some embodiments, the ferroelectric layers 600 are disposed between the conductive layer 212 (i.e. word line) and the first conductive structure 223 (i.e. source structure) or between the conductive layer 212 (i.e. word line) and the second conductive structure 224 (i.e. drain structure). In some embodiments, the conductive layers 212 (i.e. word lines) can control the adjacent cells in the same level. As shown in FIG. 3, the ferroelectric layer 600 has an L-shaped vertical cross section; correspondingly, the semiconductor layer 226 formed along the ferroelectric layer 600 also has an L-shaped vertical cross section. In some embodiments, the ferroelectric layer 600 comprises a longitudinal portion 610 and a horizontal portion 620 to form the L-shaped vertical cross section. In some embodiments, a longitudinal portion 2261 of the semiconductor layers 226 may be formed along the longitudinal portion 610 of the ferroelectric layer 600 and a horizontal portion 2262 of the semiconductor layers 226 may be formed on the horizontal portion 620 of the ferroelectric layer 600, so the horizontal portion 2262 of the semiconductor layers 226 may be substantially aligned with the horizontal portion 620 of the ferroelectric layer 600 as shown in FIG. 3. The first conductive structure 223 and the second conductive structure 224 can contact the substrate 110 through a gap between the horizontal portions 620 and 2262 of two ferroelectric layers 600 and two semiconductor layers 226 beside the first and second conductive structures 223 and 224. In some embodiments, as shown in FIG. 4A, each ferroelectric layer 600 is formed longitudinally along the stacking portion 210 and has a bottom contacting the substrate 110. Correspondingly, each semiconductor layer 226 is formed longitudinally along the ferroelectric layer 600 and has a bottom contacting the substrate 110.

The connection regions 300 comprise a plurality of staircase portions 310 and a plurality interval portions 320. The staircase portions 310 and the interval portions 320 are alternately arranged along the third direction D3 and can be separated by the ferroelectric layers 600. Each staircase portion 310 can be extended from the stacking portion 210 in the cell array region 200 along the second direction D2 and comprises a staircase structure 312, a dielectric layer 314 and a plurality of first conductive pillars 316. The staircase structure 312 comprises extended insulating layers 211a and extended conductive layers 212a, which are alternatively arranged and extend from the insulating layers 211 and the conductive layers 212 in the cell array region 200. As shown in FIGS. 1 and 3, the extended insulating layers 211a and extended conductive layers 212a are configured in the staircase structure 312, so that some upper portions of the extended conductive layers 212a may be exposed as upper surfaces 313a-313d of the staircase structure 312. That is, a length of one extended conductive layers 212a is greater than a length of the overlying extended insulating layers 211a and overlying extended conductive layers 212a, so a portion of an upper surface of each extended insulating layers 211a can be exposed. The extended conductive layers 212a may be surrounded by glue layers 215a and thus some upper portions of the glue layers 215a may be exposed as upper surfaces 313a-313d of the staircase structure 312. As shown in FIG. 3, there are four stairs in the staircase structure 312 and thus four upper surfaces 313a-313d are present, including the lowest stair with a first upper surface 313a, the second lower stair with a second upper surface 313b, the second upper stair with a third upper surface 313c and the topmost stair with a fourth upper surface 313d. In some embodiments, the first to fourth upper surfaces 313a-313d may have identical or different surface areas.

The dielectric layer 314 is formed on the staircase structure 312 to cover the extended insulating layers 211a and extended conductive layers 212a. In some embodiments, the top surface of the dielectric layer 314 is substantially coplanar with the top surface of the topmost insulating layer 213 in the cell array region 200.

Figure 5:
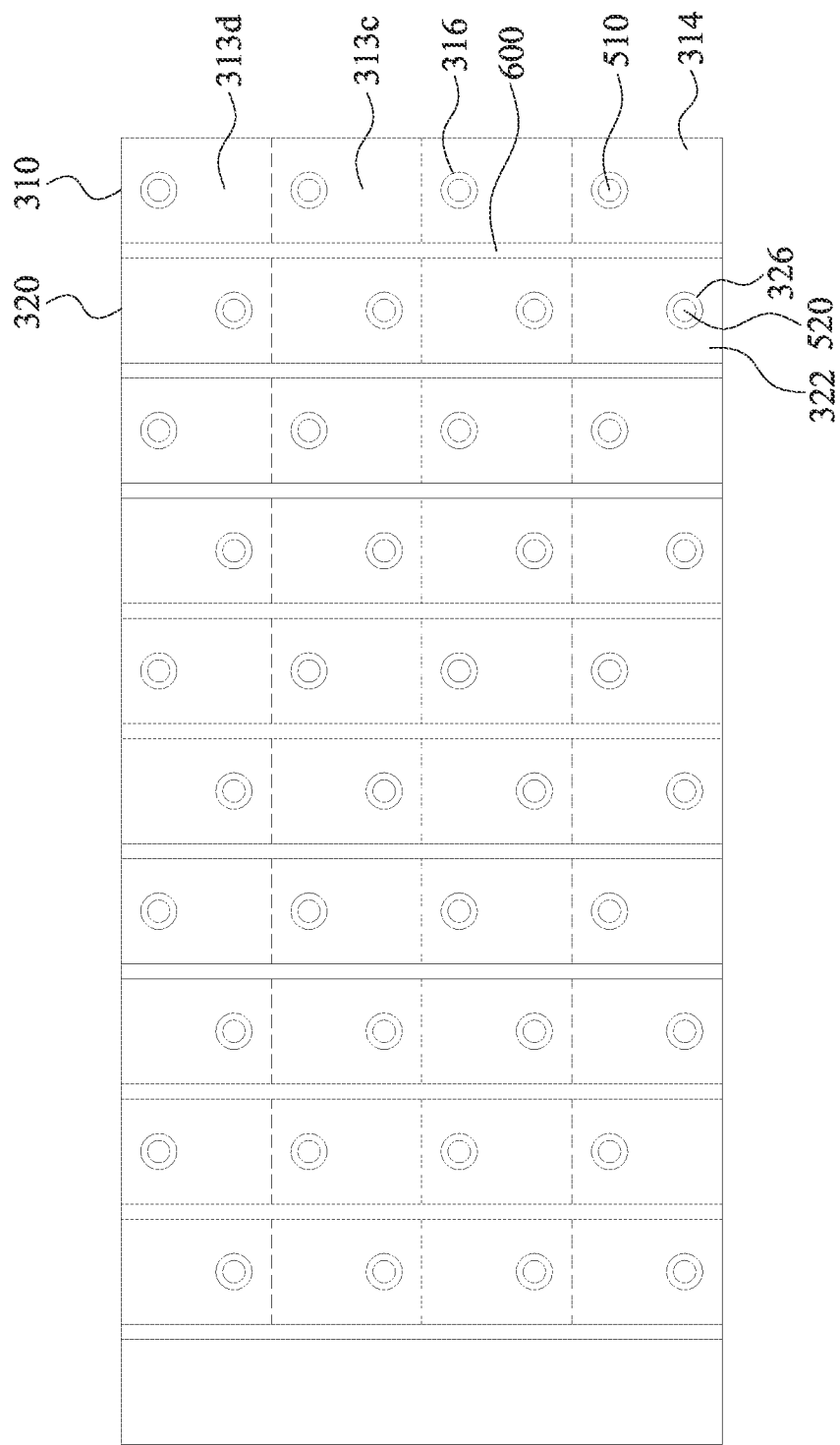
FIG. 5 is a top view of a connection region connected with vias in the semiconductor memory structure in accordance with some embodiments of the present disclosure.

The first conductive pillars 316 are formed over the staircase structure 312 and extend into the dielectric layer 314 along the first direction D1 to allow the bottom of the first conductive pillars 316 in contact with the upper surfaces 313a-313d of the staircase structure 312. In some embodiments, the number of the first conductive pillars 316 in each staircase portion 310 may be identical to the number of stairs of the staircase structure 312. In some embodiments, each first conductive pillar 316 may be a circular cylinder (as shown in FIG. 5) or a pillar with a longitudinal top surface, such as a rectangular pillar with a rectangular top surface (as shown in FIGS. 6 to 9), an elliptic pillar with an elliptic top surface and the like.

Each interval portion 320 can be extended from the cell portions 220 in the cell array region 200 and comprises an insulation structure 322 and a plurality of second conductive pillars 326. The insulation structure 322 is disposed between the ferroelectric layers 600. As mentioned above, the ferroelectric layer 600 may have an L-shaped vertical cross section, so the insulation structure 322 may contact the substrate 110. The insulation structure 322 may include nitrides (e.g., silicon nitride (SiN)) or amorphous silicon, but the disclosure is not limited thereto. The second conductive pillars 326 extend into the insulation structure 322 along the first direction D1 and penetrate through the substrate 110 to couple to memory devices 700 (such as, CUA), as shown in FIG. 4B. In some embodiments, the second conductive pillars 326 and the first conductive pillars 316 may be arranged in an array configuration, as shown in FIG. 2. In some embodiments, each second conductive pillar 326 may be a circular cylinder (as shown in FIG. 5) or a pillar with a longitudinal top surface, such as a rectangular pillar with a rectangular top surface (as shown in FIGS. 6 to 9), an elliptic pillar with an elliptic top surface and the like. When the first conductive pillars 316 and the second conductive pillars 326 are circular cylinders, the first conductive pillars 316 and the second conductive pillars 326 are arranged in an array pattern, such as a XY staggered pattern.

The first interconnect structure 400 comprises a plurality of cell array vias 410 and a plurality of first metal layers 420. The cell array vias 410 are formed on the first conductive structures 223 and the second conductive structure 224. The first metal layer 420 can be alternately coupled to the first conductive structures 223 and the second conductive structures 224 through the cell array vias 410, so that the memory device 700 formed over the substrate 110 can be coupled to the first metal layer 420 of the first interconnect structure 400 as shown in FIG. 4A. Each first metal layer 420 may extend over the cell array region 200 along the third direction D3. When the first conductive structures 223 correspond to source structures and the second conductive structure 224 correspond to the drain structures, the first metal layer 420 coupling to the first conductive structures 223 are source lines and the first metal layer 420 coupling to the second conductive structure 224 are bit lines. When the first conductive structures 223 correspond to drain structures and the second conductive structure 224 correspond to the source structures, the first metal layer 420 coupling to the first conductive structures 223 are bit lines and the first metal layer 420 coupling to the second conductive structure 224 are source lines.

The second interconnect structure 500 comprises a plurality of first vias 510, a plurality of second vias 520, and a plurality of second metal layer 530. The first vias 510 are formed on the first conductive pillar 316 in the staircase portions 310. The second vias 520 are formed on the second conductive pillars 326 in the interval portions 320. In some embodiments, each of the first conductive pillars 316 is coupled to one first via 510, and each of the second conductive pillars 326 is coupled to one second via 520. The second metal layers 530 can be coupled to the first conductive pillars 316 and the second conductive pillars 326 through the first vias 510 and the second vias 520, respectively, so that the memory device 700 formed over the substrate 110 can be coupled to the second metal layer 530 of the second interconnect structure 500 as shown in FIG. 4B. In some embodiments, each second metal layer 530 connects the first via 510 formed on one staircase portion 310 to the second via 520 formed on an adjacent interval portion 320.

In some embodiments, as shown in FIG. 2, when the first conductive pillars 316 and second conductive pillars 326 are pillars with longitudinal top surfaces, the first vias 510 may be formed on a first end of the longitudinal top surfaces of the first conductive pillar 316 and the second vias 520 are formed on a second end of the longitudinal top surfaces of the second conductive pillars 326. The first end and the second end present a XY staggered pattern, so that the first vias 510 and the second vias 520 are also arranged in a XY staggered pattern.

In some embodiments, as shown in FIG. 5, when the first conductive pillars 316 and the second conductive pillars 326 are circular cylinders, the first vias 510 and the second vias 520 formed on the first conductive pillar 316 and the second conductive pillars 326 are also arranged in a XY staggered pattern.

Since the first vias 510 and the second vias 520 are arranged in a XY staggered pattern, the distance between the first vias 510 and the second vias 520 can be increased to allow the first vias 510 and the second vias 520 to be formed through a photolithography operation with one mask, which would reduce the complexity of procedure and save time and costs as well.

Figure 6:
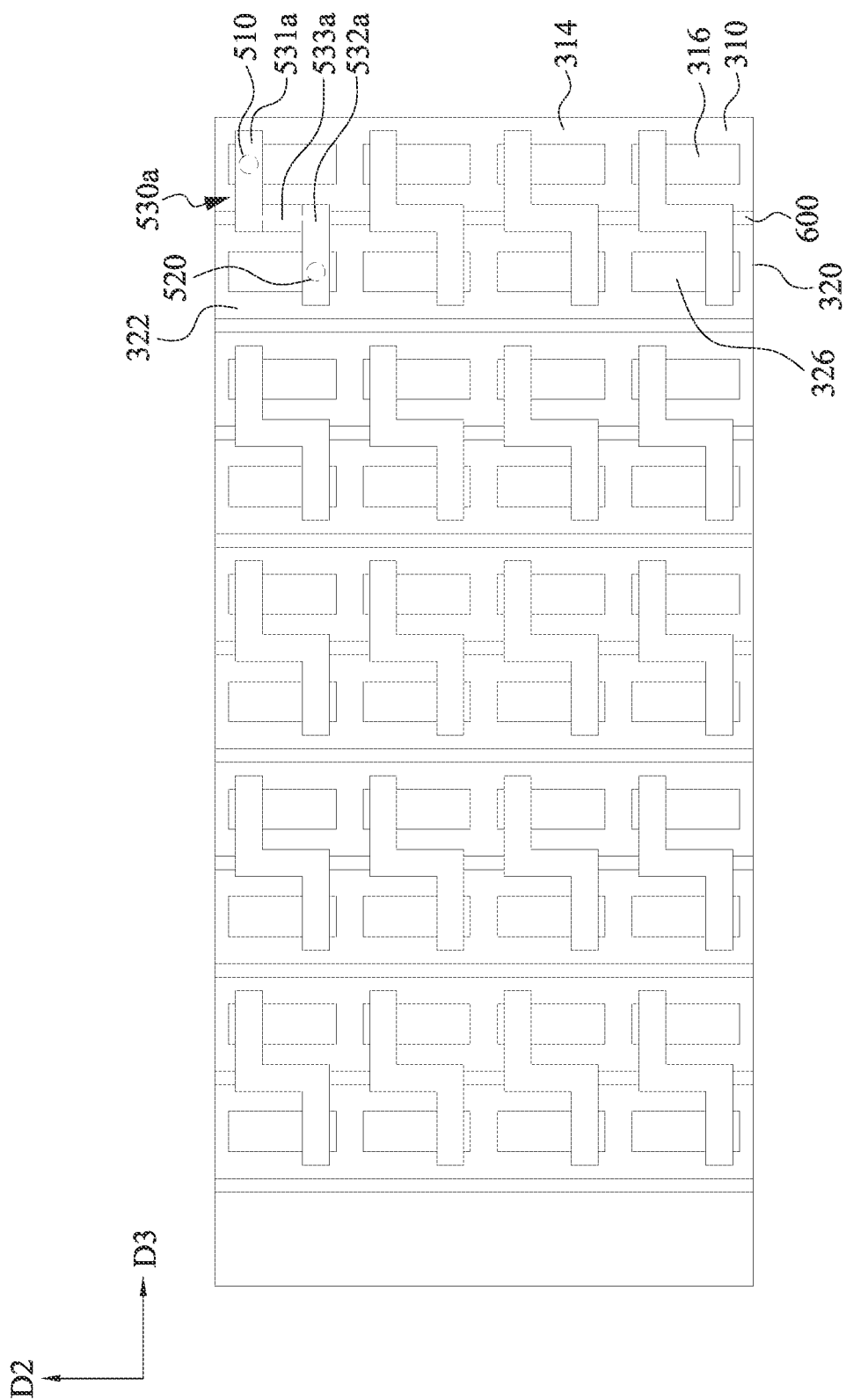
FIG. 6 is a top view of a connection region connected with an interconnect structure in a semiconductor memory structure in accordance with some embodiments of the present disclosure.

In some embodiments, due to the XY staggered vias 510 and 520, the second metal layer 530 may have a non-linear shape and may have different shapes, including Z shape, L shape and so on. As shown in FIG. 6, in some embodiments, the second metal layer 530a may comprise a first part 531a connecting to the first via 510 on the first conductive pillar 316, a second part 532a connecting to the second vias 520 on the second conductive pillar 326 and a connection part 533a connecting the first part 531a with the second part 532a. The first part 531a connects to the first via 510 on the first conductive pillar 316 in one staircase portion 310 and may extend along the third direction D3 toward an adjacent interval portion 320. The first part 531a may have a longitudinal shape (such as rectangular shape), which extends along the third direction D3 and thus is perpendicular to the longitudinal top surface of the first conductive pillar 316. The second part 532a connects the second vias 520 on the second conductive pillar 326 in one interval portion 320 and may extend along the third direction D3 toward an adjacent staircase portion 310, so that the second part 532a and the first part 531a extend toward each other. The second part 532a may have a longitudinal shape (such as rectangular shape), which extends along the third direction D3 and thus is perpendicular to the longitudinal top surface of the second conductive pillar 326.

Figure 7:
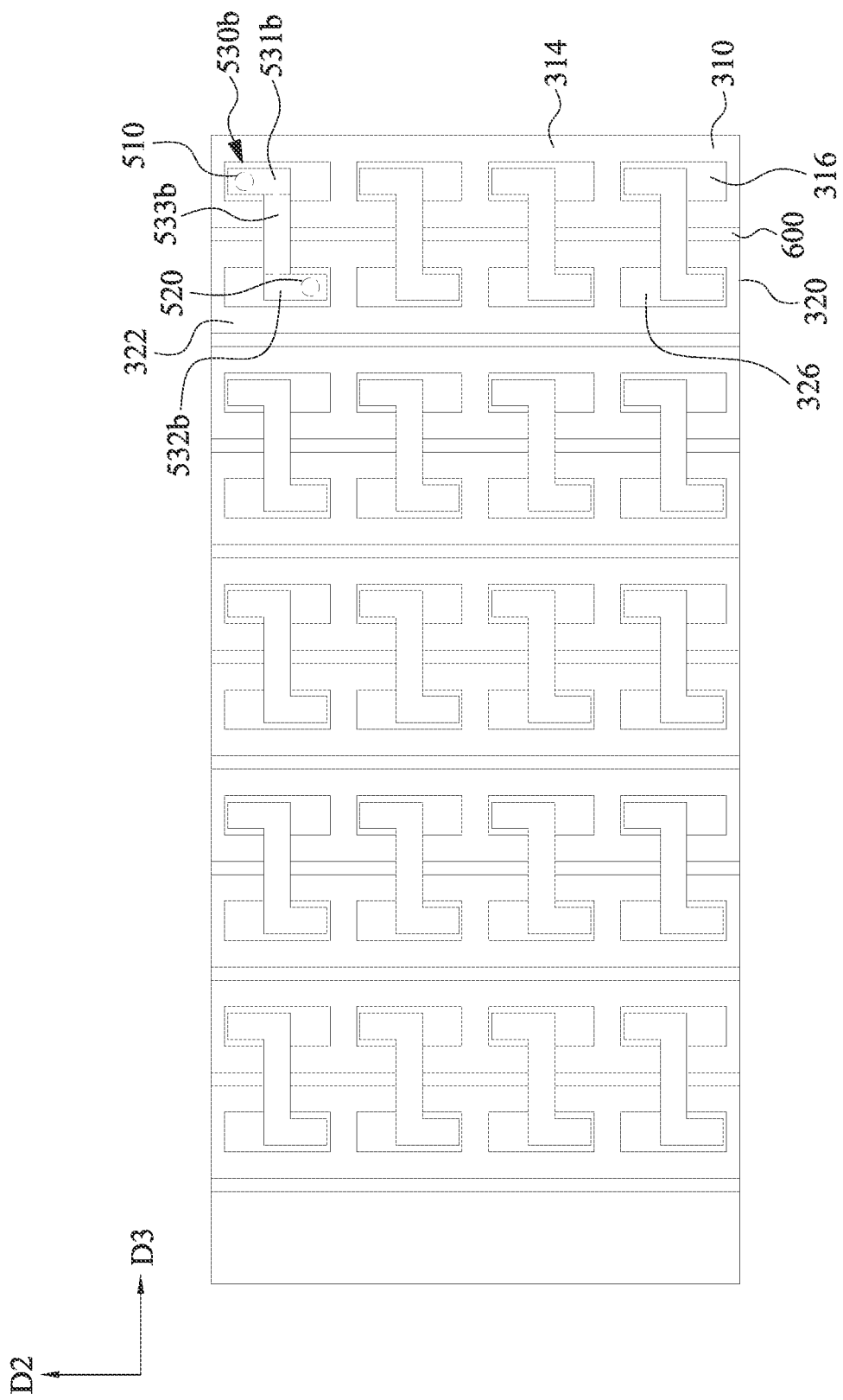
FIG. 7 is a top view of a connection region connected with an interconnect structure in a semiconductor memory structure in accordance with some another embodiments of the present disclosure.

As shown in FIG. 7, in some embodiments, each second metal layer 530b may comprise a first part 531b connecting the first via 510 on the first conductive pillar 316, a second part 532b connecting the second vias 520 on the second conductive pillar 326 and a connection part 533b connecting the first part 531b with the second part 532b. The first part 531b connects the first via 510 on the first conductive pillar 316 in one staircase portion 310 and may extend along the second direction D2. The first part 531b may have a longitudinal shape (such as rectangular shape), which extends along the second direction D2 and thus is parallel to the longitudinal top surface of the first conductive pillar 316. The second part 532b connects the second vias 520 on the second conductive pillar 326 in one interval portion 320 and may extend along the second direction D2, so that the second part 532b and the first part 531b are parallel with each other. The second part 532b may have a longitudinal shape (such as rectangular shape), which extends along the second direction D2 and thus is parallel to the longitudinal top surface of the second conductive pillar 326. The connection part 533b extends along the third direction D3 and thus is perpendicular to the first part 531b and to the second part 532b.

Figure 8:
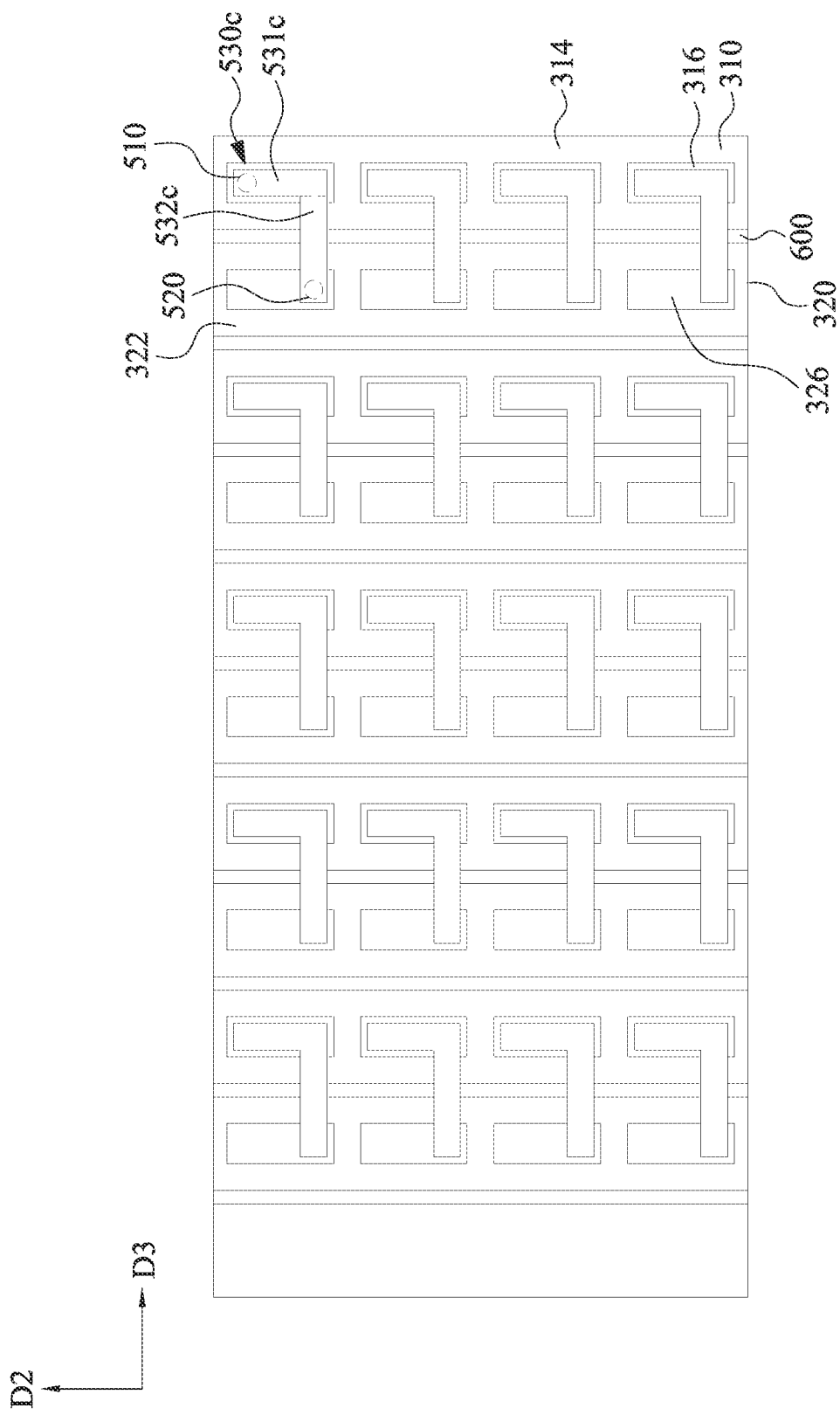
FIG. 8 is a top view of a connection region connected with an interconnect structure in a semiconductor memory structure in accordance with some another embodiments of the present disclosure.

As shown in FIG. 8, in some embodiments, the second metal layer 530c may comprise a first part 531c connecting the first via 510 on the first conductive pillar 316 and a second part 532c connecting the second vias 520 on the second conductive pillar 326. The first part 531c connects the first via 510 on the first conductive pillar 316 in one staircase portion 310 and may extend along the second direction D2. The first part 531c may have a longitudinal shape (such as rectangular shape), which extends along the second direction D2 and is parallel to the longitudinal top surface of the first conductive pillar 316. The second part 532c connects the second vias 520 on the second conductive pillar 326 in one interval portion 320 and may extend along the third direction D3 and toward an adjacent staircase portion 310, so that the second part 532c and the first part 531c can be connected. The second part 532c may have a longitudinal shape (such as rectangular shape), which extends along the third direction D3 and is perpendicular to the longitudinal top surface of the second conductive pillar 326.

Figure 9:
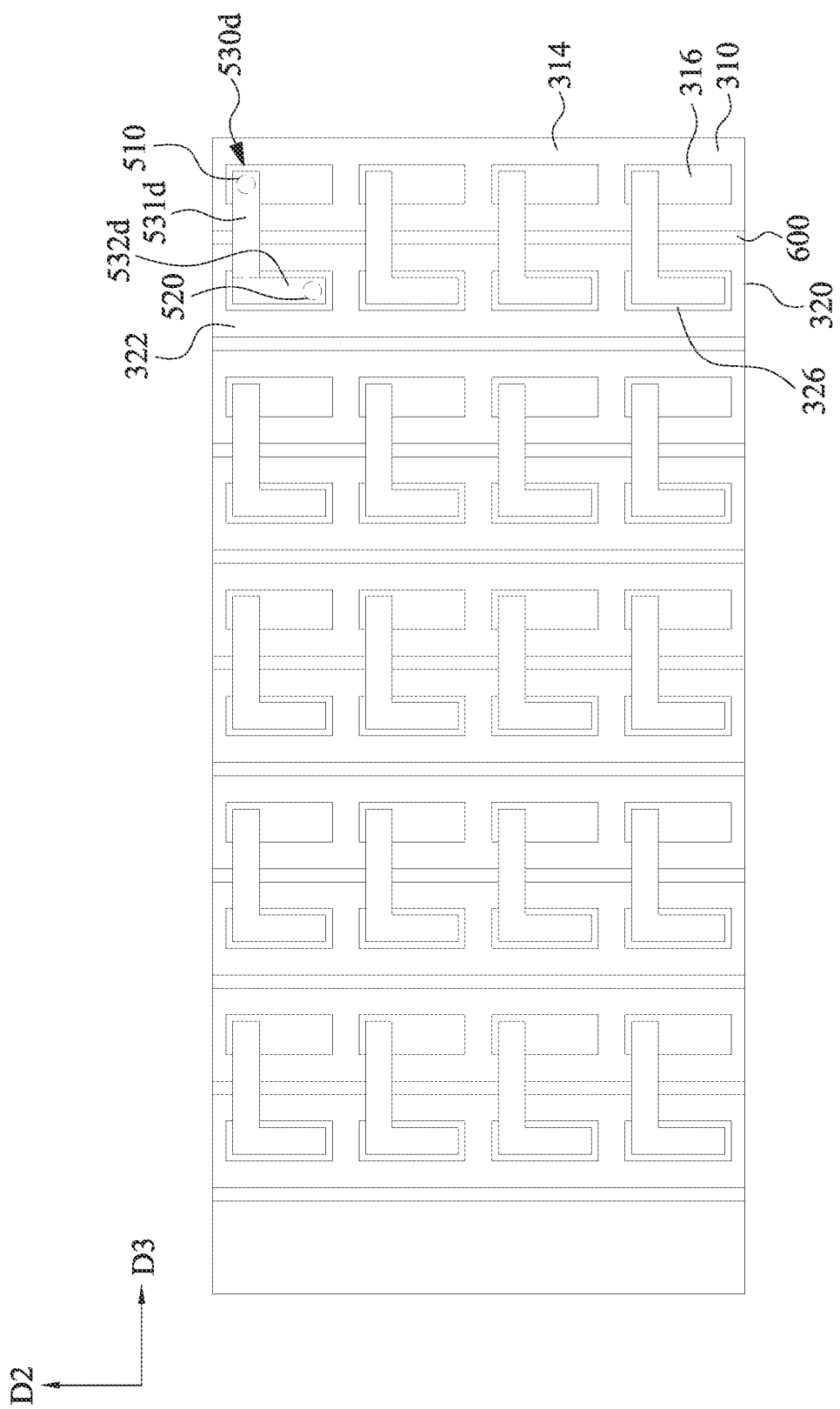
FIG. 9 is a top view of a connection region connected with an interconnect structure in a semiconductor memory structure in accordance with some another embodiments of the present disclosure.

As shown in FIG. 9, in some embodiments, the second metal layer 530d may comprise a first part 531d connecting the first via 510 on the first conductive pillar 316 and a second part 532d connecting the second vias 520 on the second conductive pillar 326. The first part 531d connects the first via 510 on the first conductive pillar 316 in one staircase portion 310 and may extend along the third direction D3 and toward an adjacent interval portion 320. The first part 531d may have a longitudinal shape (such as rectangular shape), which extends along the third direction and is perpendicular to the longitudinal top surface of the first conductive pillar 316. The second part 532d connects the second vias 520 on the second conductive pillar 326 in the adjacent interval portion 320 and may extend along the second direction D2, so that the second part 532d and the first part 531c can be connected. The second part 532d may have a longitudinal shape (such as rectangular shape), which extends along the second direction D2 and is perpendicular to the longitudinal top surface of the second conductive pillar 326.

Figure 10:
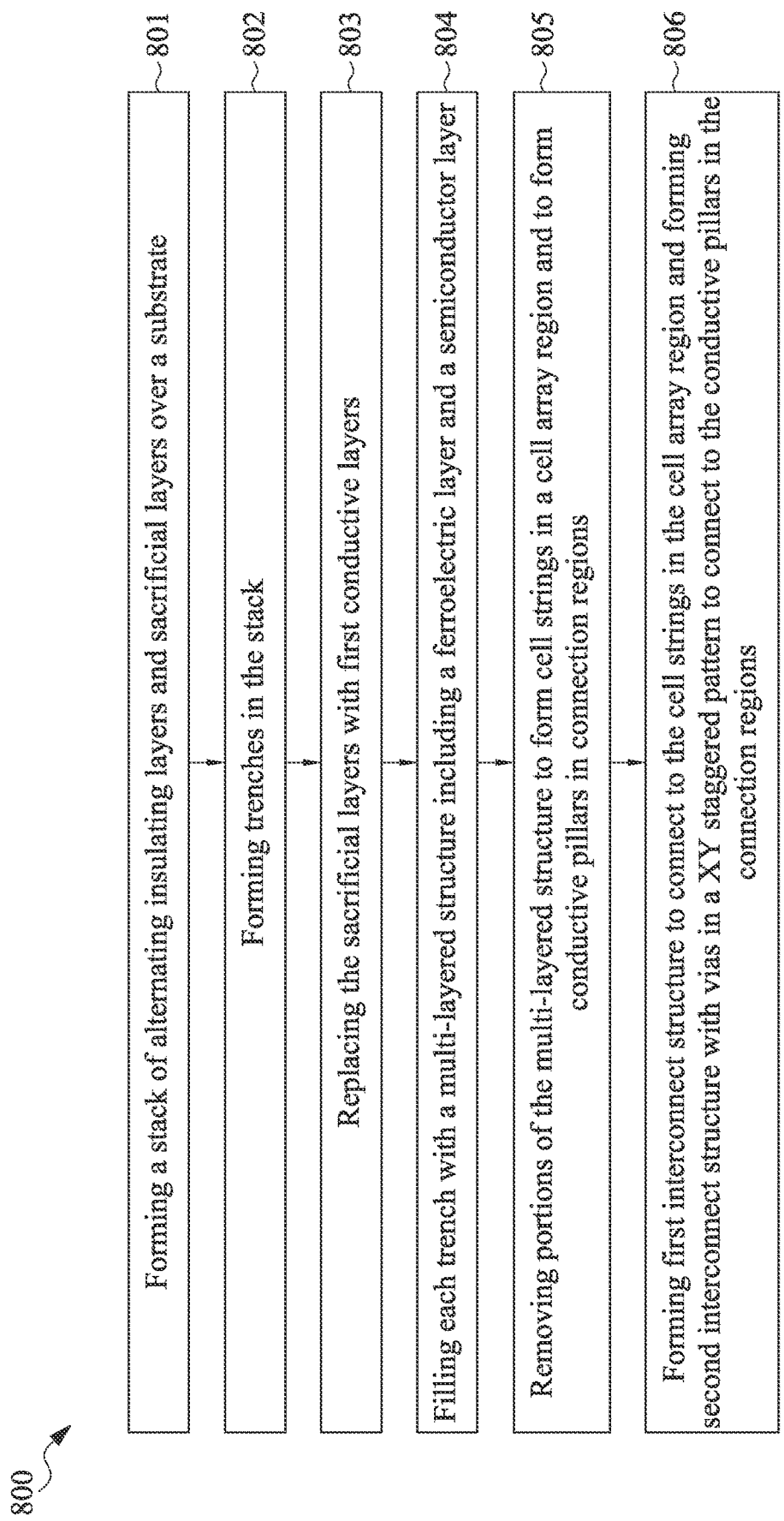
FIG. 10 is a flow diagram of a method of manufacturing a semiconductor memory structure in accordance with some embodiments of the present disclosure.

FIG. 10 is a flowchart representing a method 800 for forming a semiconductor memory structure 100 according to various aspects of the present disclosure. In some embodiments, the semiconductor memory structure 100 can be formed by the method 800, but the disclosure is not limited thereto. The method 800 includes a number of operations (801, 802, 803, 804, 805 and 806) and the description and illustration are not deemed as a limitation as the sequence of the operations and the structure of the semiconductor memory structure. In FIGS. 11 to 20, the reference numerals will be given like those, which have already been described above so as to omit the repetition of similar descriptions. In addition, portions about which no particular description will be made have the similar constructions to those of the semiconductor memory structure 100 described above and provide the same advantages provided thereby. It should be noted that the operations of the method 800 may be rearranged or otherwise modified within the scope of the various aspects. It should further be noted that additional processes may be provided before, during, and after the method 800, and that some other processes may be only briefly described herein.

With reference to FIG. 10, method 800 of manufacturing a semiconductor memory device includes forming a stack of alternating insulating layers and sacrificial layers over a substrate in operation 801; forming trenches in the stack in operation 802; replacing the sacrificial layers with conductive layers in operation 803; filling each trench with a multi-layered structure including a ferroelectric layer and a semiconductor layer in operation 804; removing portions of the multi-layered structure to form cell strings in a cell array region and to form conductive pillars in connection regions in operation 805; and forming first interconnect structure to connect to the cell strings in the cell array region and forming second interconnect structure with vias in a XY staggered pattern to connect to the conductive pillars in the connection regions in operation 806.

Figure 11:
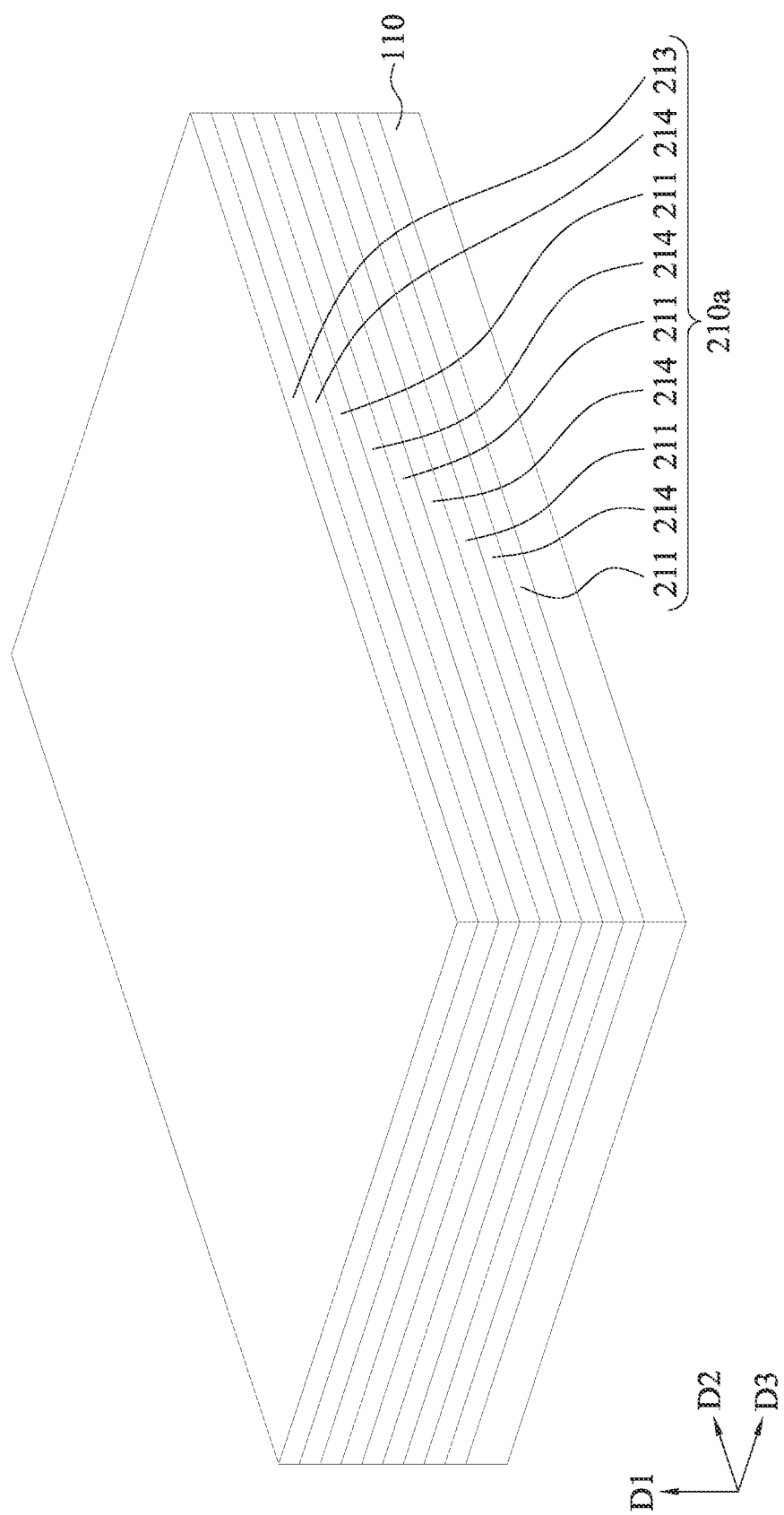
FIGS. 11, 12, 13, 14, 15A, 16, 17, 18, 19A and 20 are perspective views illustrating various stages in a method for forming a semiconductor memory structure according to aspects of one or more embodiments of the present disclosure.

Method 800 begins at operation 801 by forming a stack of alternating insulating layers 211 and first sacrificial layers 214 over a substrate 110, as shown in FIG. 11. In some embodiments, the substrate 110 is provided as having already undergone several processing steps. In some embodiments, the substrate 110 may be any suitable substrate such as a silicon, germanium, silicon-germanium, undoped, doped, bulk, silicon-on-insulator ("SOI") or other substrate with or without additional circuitry. In some embodiments, the stack 210a includes a plurality of insulating layers 211 and a plurality of first sacrificial layers 214, which are parallel to each other and sequentially stacked along a first direction D1. In some embodiments, the topmost layer of the stack 210a is a topmost insulating layer 213. In some embodiments, the number of the alternating layers included in the stack 210a can be made as high as the number of layers needed. In some embodiments, the stack 210a may include between 16 and 512 layers of alternating insulating layers 211 and 213 and first sacrificial layers 214, whereby each insulating or sacrificial layer constitutes one layer. In some embodiments, the insulating layers 211 include an insulating material, such as oxides (e.g., silicon oxide ($SiO_2$)). In some embodiments, the first sacrificial layers 214 may include nitrides (e.g., silicon nitride (SiN)) or amorphous silicon. Other insulating materials may be used instead of silicon oxide. Other sacrificial materials may be used instead of silicon nitride. In some embodiments, each of the insulating layers 211 and the first sacrificial layers 214 may have substantially identical thickness. In some embodiments, the insulating layers 211 and the first sacrificial layers 214 for forming the alternating stack 210a may be deposited using any suitable technique, such as atomic layer deposition (ALD), plasma enhanced atomic layer deposition (PEALD), chemical vapor deposition (CVD), plasma enhanced chemical vapor deposition (PECVD), and sputtering. In some embodiments, the insulating layers 211 and the first sacrificial layers 214 may be deposited by PECVD.

Figure 12:
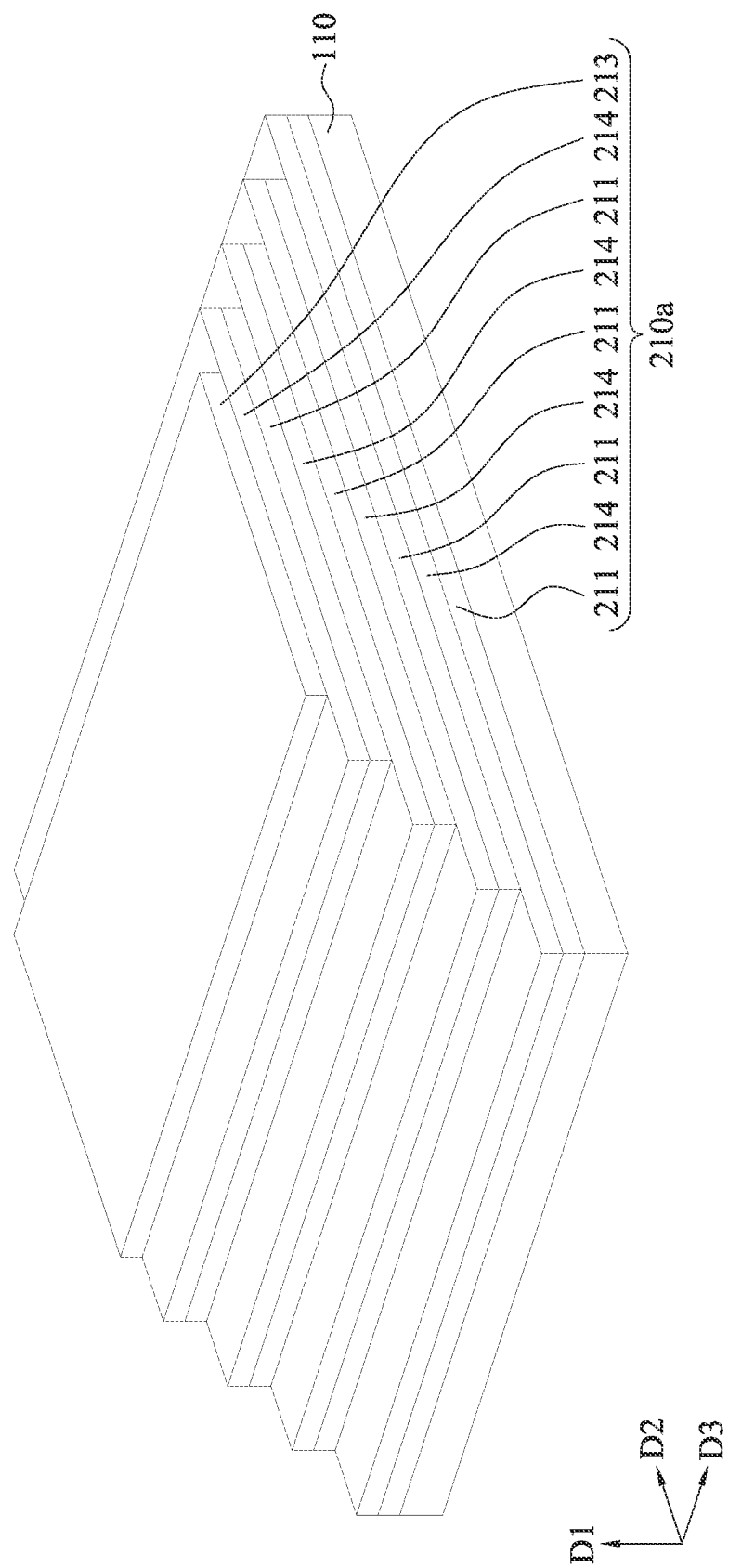

Referring to FIG. 12, portions of the insulating layers 211 and 213 and portions of the first sacrificial layers 214 are removed, such that remaining insulating layers 211 and 213 and remaining first sacrificial layers 214 form a staircase structure over the substrate 110. In some embodiments, portions of the first sacrificial layers 214 are exposed, and areas of the exposed portions of the first sacrificial layers 214 can be similar. In some embodiments, the remaining portion of the topmost insulating layer 213 can be used to define a location and a dimension of a cell array region 200.

Figure 13:
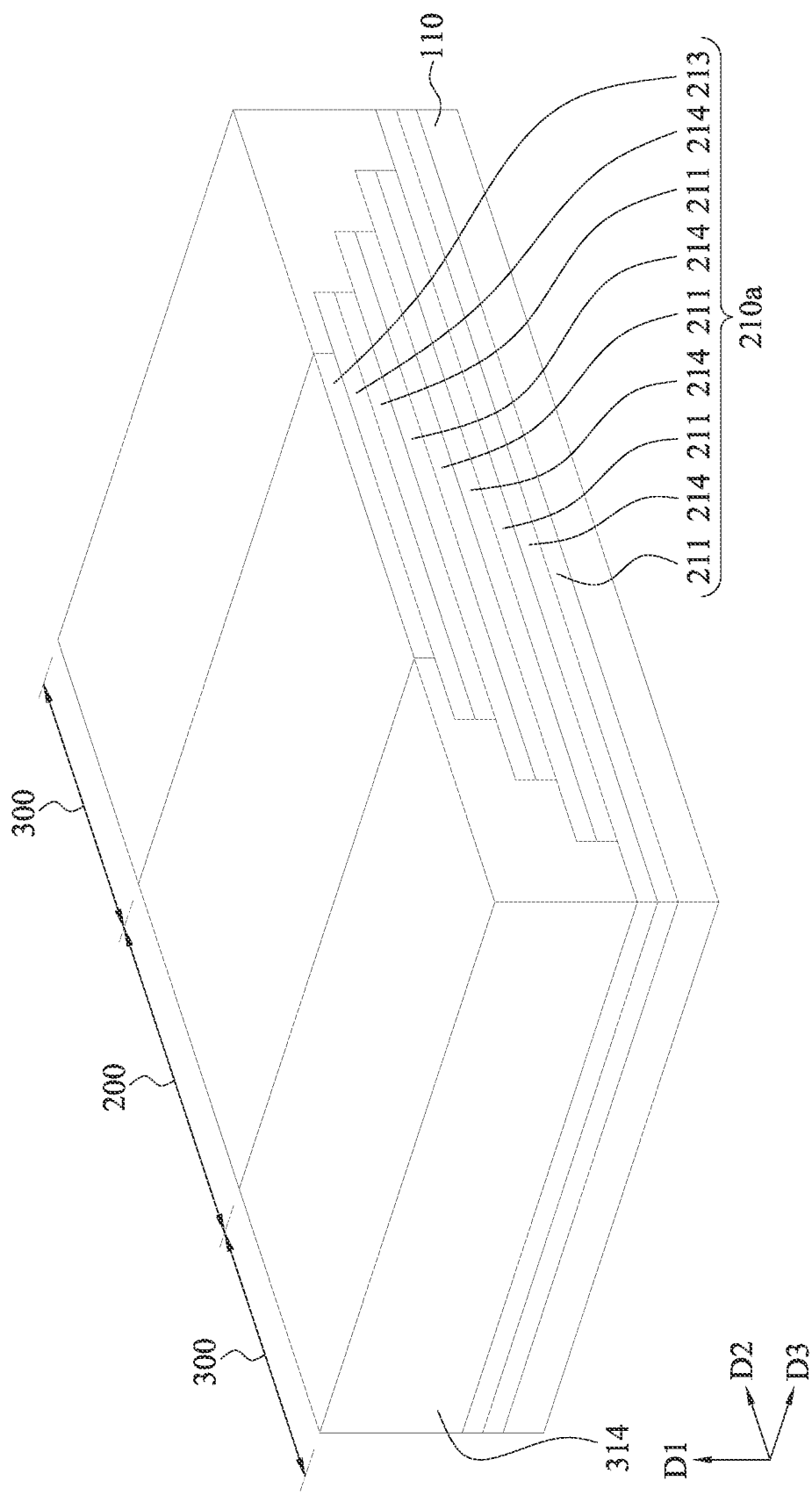

Referring to FIG. 13, in some embodiments, a dielectric layer 314 can be formed over the stack 210a. Further, a top surface of the dielectric layer 314 can be aligned with a top surface of the topmost insulating layer 213. Consequently, an even and flush surface can be obtained and the cell array region 200 defined by the topmost insulating layer 213 can be disposed between two connection regions 300.

Figure 14:
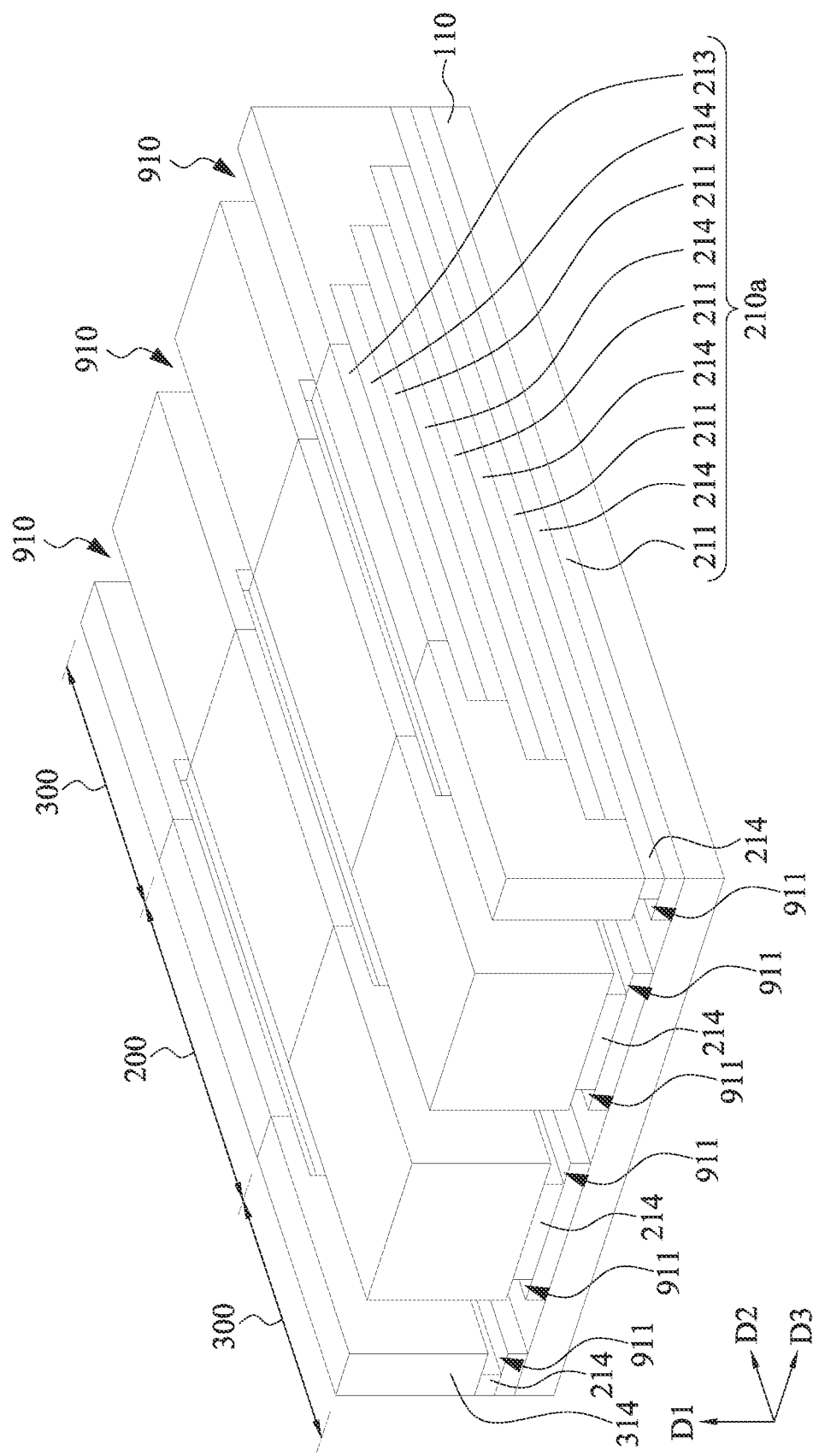

At operation 802 with reference to FIG. 14, in some embodiments, a plurality of first trenches 910 are formed in the cell array region 200 and the connection regions 300. In some embodiments, each of the first trenches 910 extends along a second direction D2 and the first trenches 910 are arranged along a third direction D3, which is different from the first and second directions D1 and D2. In some embodiments, the first direction D1 and the second direction D2 are perpendicular to each other. In some embodiments, the third direction D3 is perpendicular to the second direction D2 and is also perpendicular to the first direction D1. Further, widths and depths of the first trenches 910 are similar to each other. In some embodiments, the substrate 110 can be exposed through a bottom of each first trench 910, but the disclosure is not limited thereto. In some embodiments, the insulating layers 211 and the first sacrificial layers 214 can be exposed from the sidewalls of each first trench 910.

At operation 803, the first sacrificial layers 214 can be replaced by conductive materials to form conductive layers 212 (i.e. word lines). As also shown in FIG. 14, some portions of the first sacrificial layers 214 may be removed from the first trenches 910 to form first recesses 911, so that the first sacrificial layers 214 will be replaced with conductive materials to form word lines. In some embodiments, the first sacrificial layers 214 (e.g., silicon nitride) can be selectively etched relative to insulating layers 211 and 213 (e.g., silicon oxide) over the substrate 110 via the first trenches 910. In some embodiments, the removal of the first sacrificial layers 214 may involve introducing an etchant via the first trenches 910. In some embodiments, etching may be performed using a selective dry etch process, such as by exposing the substrate to any one or more of the following gases: chlorine ($Cl_2$), oxygen ($O_2$), nitrous oxide ($N_2O$), or the like, but is not limited thereto. It will be understood that the selective etching involves etching a first sacrificial layers 214 at a rate faster than etching materials for insulating layers 211 and 213. Any suitable etching process and etchant may be used.

Figure 15A:
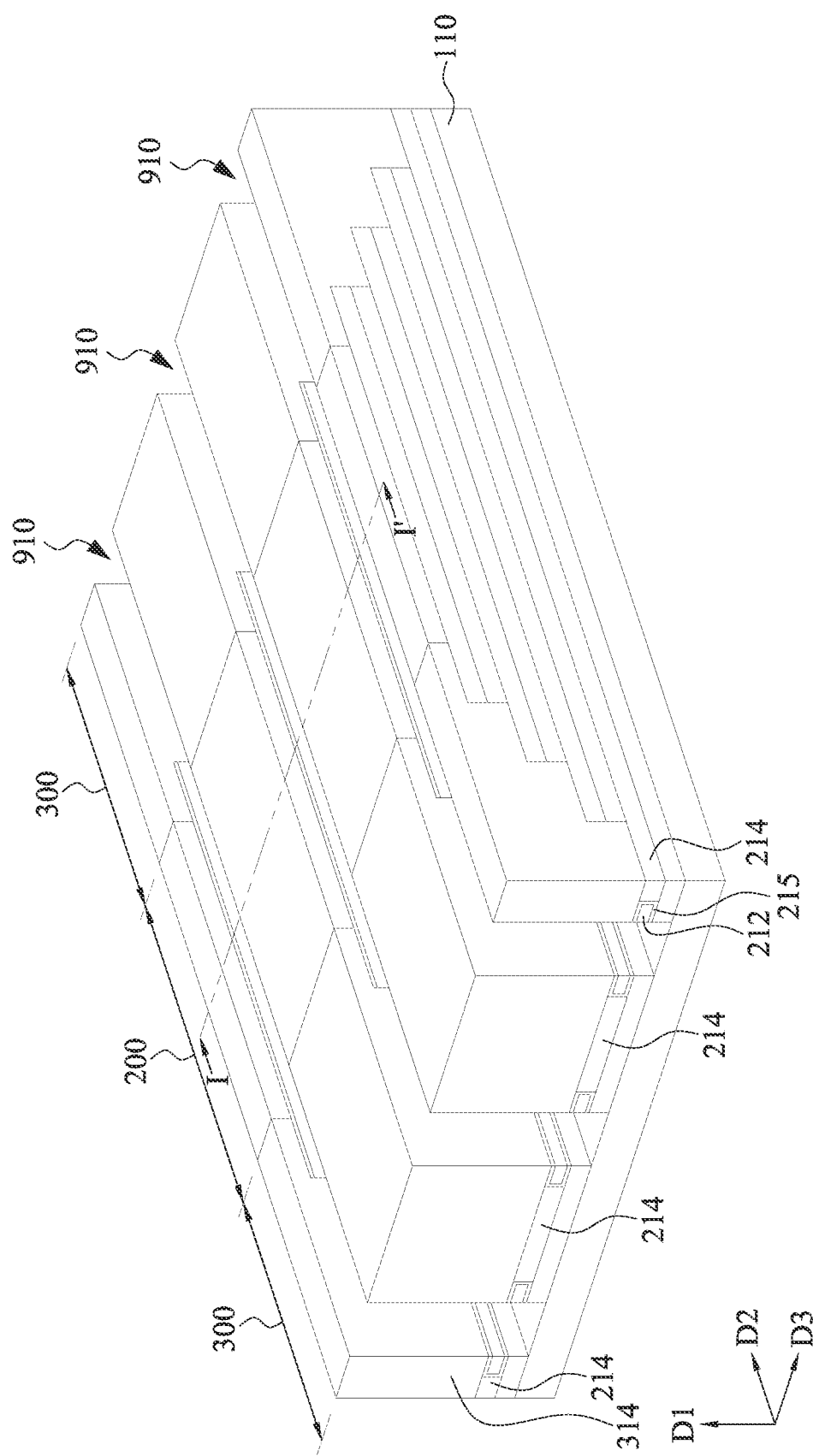
Figure 15B:
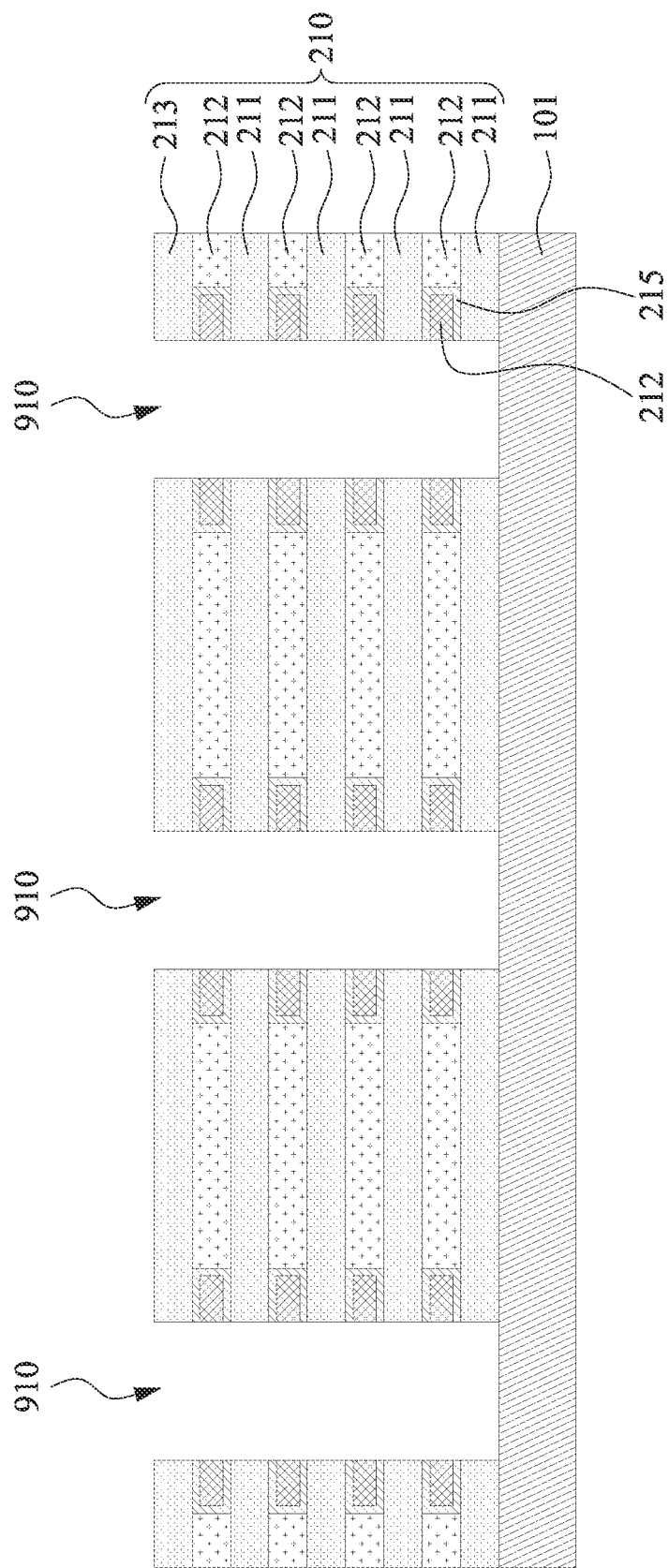
FIG. 15B is a schematic cross-sectional side views taken along line I-I' of FIG. 15A.
Figure 16:
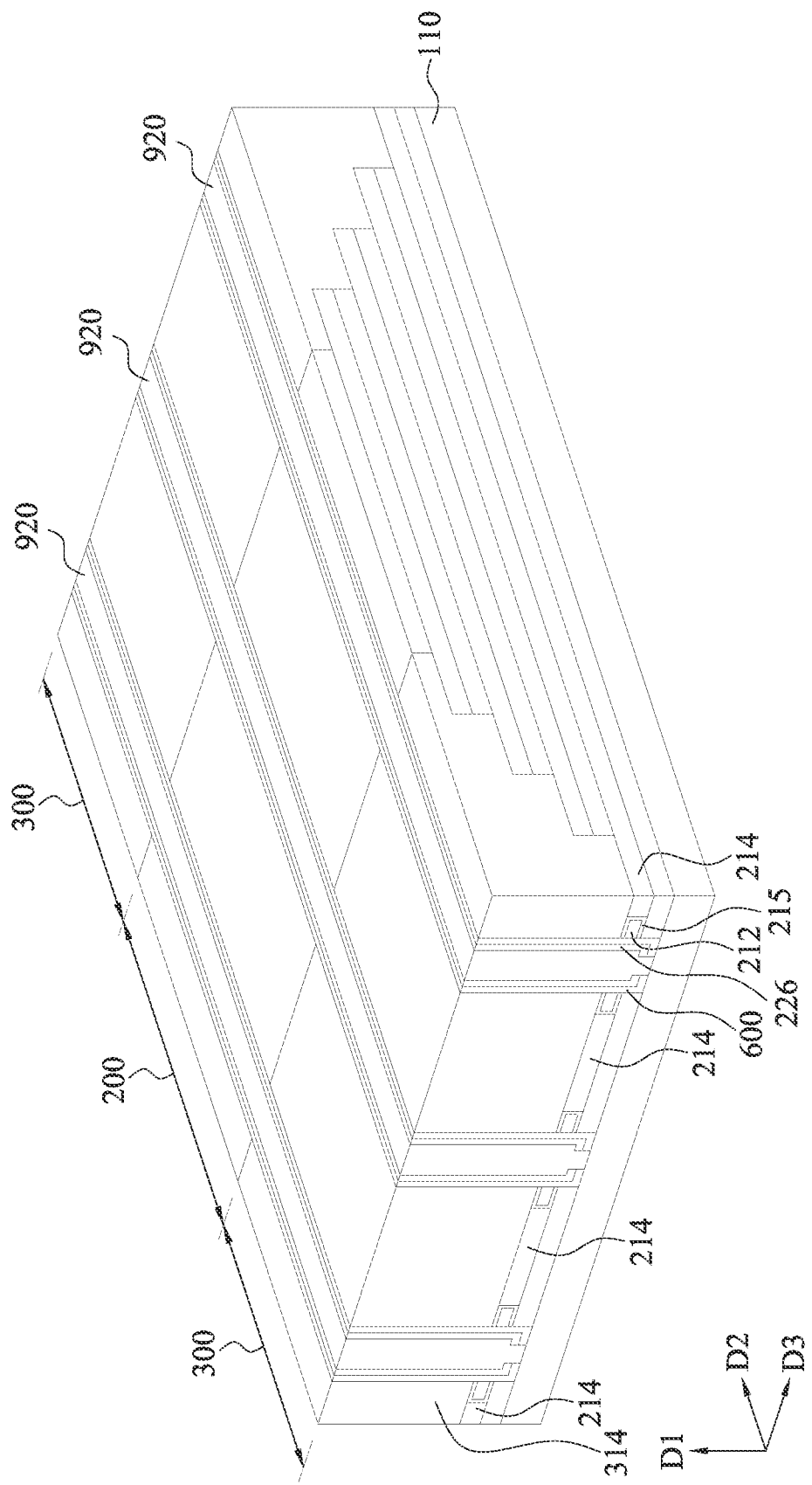

At operation 803 with further reference to FIGS. 15A and 15B, conductive layers 212 can be formed in the first recesses 911 via the first trenches 910 to form word lines. After replacing the first sacrificial layers 214 with the conductive layer 212, a metal/oxide stack is formed, in which the insulating layers 211 and 213 (e.g., silicon oxide ($SiO_2$)) can separate the metal word lines. In some embodiments, the conductive layers 212 include various conductive materials, e.g., metal such as aluminum (Al), titanium (Ti), cobalt (Co), silver (Ag), gold (Au), copper (Cu), nickel (Ni), chromium (Cr), hafnium (Hf), rhodium (Ru), tungsten (W), platinum (Pt) and/or alloys thereof, or a metal nitride such as titanium nitride (TiN), tantalum nitride (TaN), or the like, but is not limited thereto. In some embodiments, chemical vapor deposition (CVD) or atomic layer deposition (ALD) may be used to deposit the conductive layers 212. In some embodiments, the excessive conductive material, e.g., the materials outside the recesses, at the bottom of the first trenches 910, and on the surface of the topmost insulating layer 213, can be removed, e.g., by etching, so that the bottom surfaces of the first trenches 910, the sidewalls of the insulating layers 211, and the surface of the topmost insulating layer 213 can be exposed.

In some embodiments, before forming the conductive layers 212 in the first recesses 911, glue layers 215 may be formed along the sidewall of the first recesses 911, so that the shape of glue layers 215 corresponds to the sidewall of the first recesses 911. For example, each glue layer 215 may have a U shape, V shape, W shape and so on, depending on the shape of the sidewalls of the recesses 911, but the disclosure is not limited thereto. The glue layers 215 may be formed by using ALD, CVD, physical vapor deposition (PVD) or other methods. Each glue layer 215 partially surrounds the corresponding conductive layer 212, so that the conductive layer 212 can be exposed from the first trench 910 but not contact the adjacent insulating layers 211 and/or dielectric layer 314. The glue layer 215 can improve adhesion of the conductive layer 212 with adjacent insulating layers 211 and/or dielectric layer 314.

Operation 804 includes filling each of the first trenches 910 with a multi-layered structure. The multi-layered structure can be formed by any suitable methods that are known in the art. In some embodiments, referring to FIG. 16, the first trenches 910 may be filled by sequentially depositing a ferroelectric layer 600 and a semiconductor layer 226 along the sidewalls and bottoms of the first trenches 910, e.g., using ALD. In some embodiments, other suitable layers, such as an interfacial layer, e.g., $SiO_2$, SiON, or $Al_2O_3$, can be formed in combination with the ferroelectric layer 600. In some embodiments, portions of the ferroelectric layer 600 and portions of the semiconductor layer 226 may be removed from the bottom of the first trenches 910, so as to expose the substrate 110 from the first trenches 910. Hence, from the cross-sectional side view, the ferroelectric layer 600 has an L-shaped vertical cross section; correspondingly, the semiconductor layer 226 forming along the ferroelectric layer 600 also has an L-shaped vertical cross section.

In some embodiments, the first trenches 910 can be filled with a first sacrificial material 920. In some embodiments, after filling the first trenches 910 with these layers, a chemical mechanical polishing (CMP) may be carried out to planarize the surface of the structure. The first sacrificial material 920 may include nitrides (e.g., silicon nitride (SiN)) or amorphous silicon, but the disclosure is not limited thereto.

Figure 17:
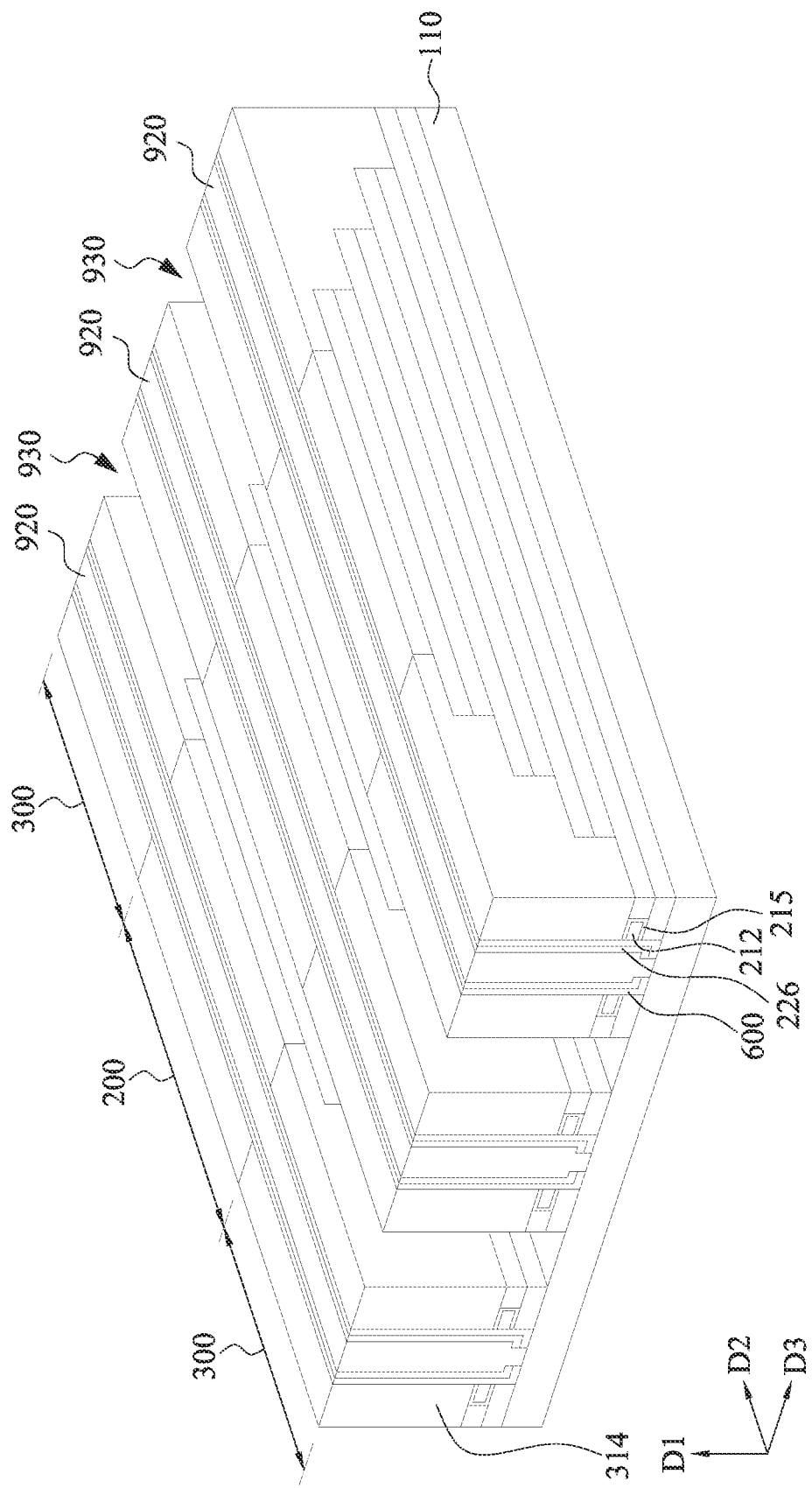
Figure 18:
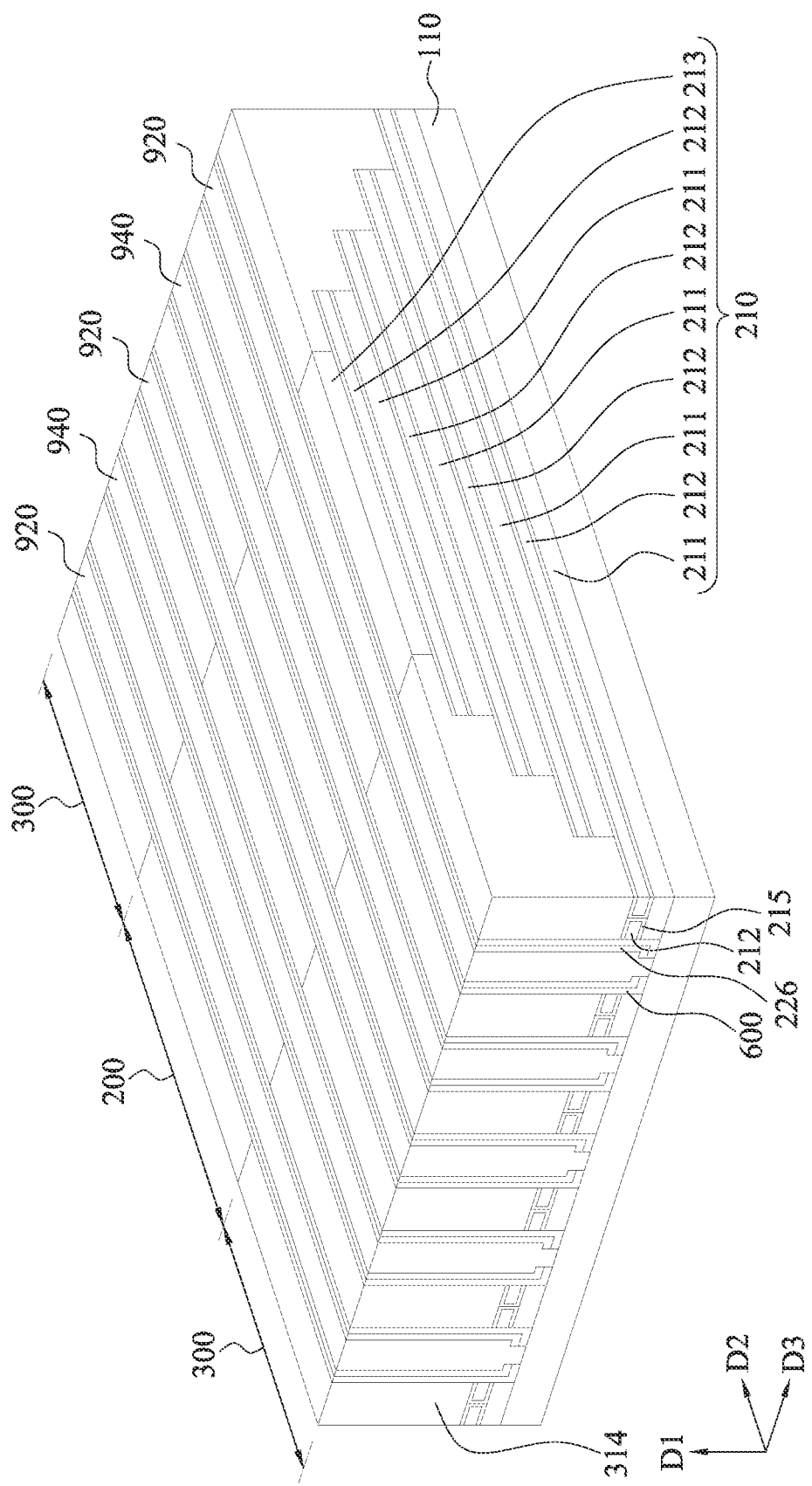

Operations 802 to 804 may be performed twice or more times. FIG. 17 shows that second trenches 930 can be formed in the cell array region 200 and the connection regions 300 to expose the first sacrificial layers 214 from the second trenches 930. Each second trench 930 can be formed at a location between two multi-layered structure filled in the first trenches 910. FIG. 18 shows that the first sacrificial layers 214 can be replaced by metal to form conductive layers 212 (i.e. word lines); and, in some embodiments, glue layers 215 may be formed to adhere the conductive layers 212 to adjacent insulating layers 211 and/or adjacent glue layers 215 previously formed through the first trenches 910. Each of the second trenches 930 may be filled with a multi-layered structure, including a ferroelectric layer 600, a semiconductor layer 226 and a second sacrificial material 940, identical or similar to the multi-layered structure formed in the first trenches 910; therefore, repeated descriptions of such details are omitted for brevity. The second sacrificial material 940 may include nitrides (e.g., silicon nitride (SiN)) or amorphous silicon, but the disclosure is not limited thereto. In some embodiments, widths of the multi-layered structure in the first trenches 910 and widths of the multi-layered structure in the second trenches 930 are similar. As shown in FIG. 18, the multi-layered structures in the first trenches 910 and the multi-layered structures in the second trenches 930 are alternately arranged along the third direction D3. Further, distances between the adjacent multi-layered structures in the first trench 910 and the second trench 930 are similar.

Figure 19A:
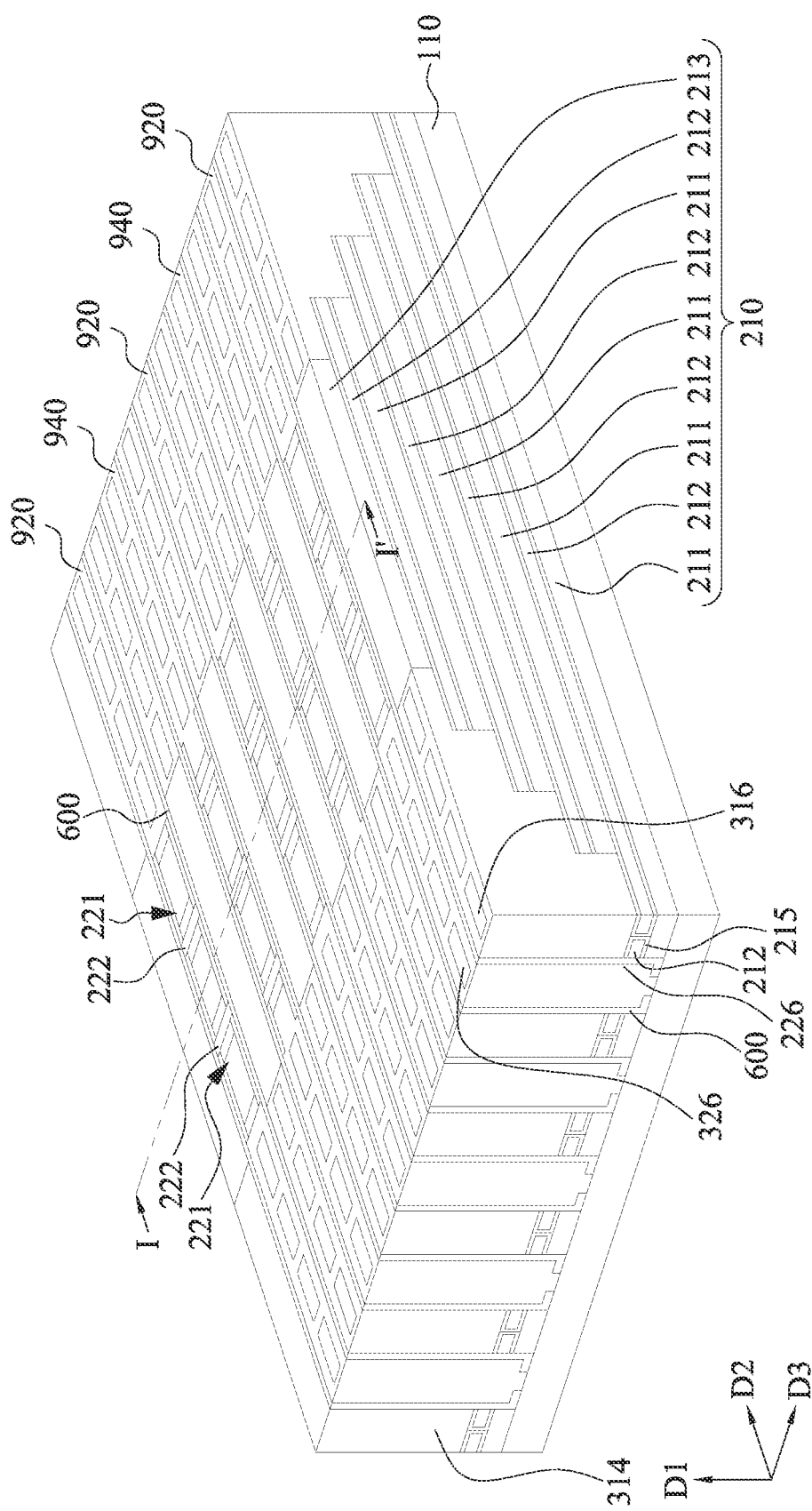
Figure 19B:
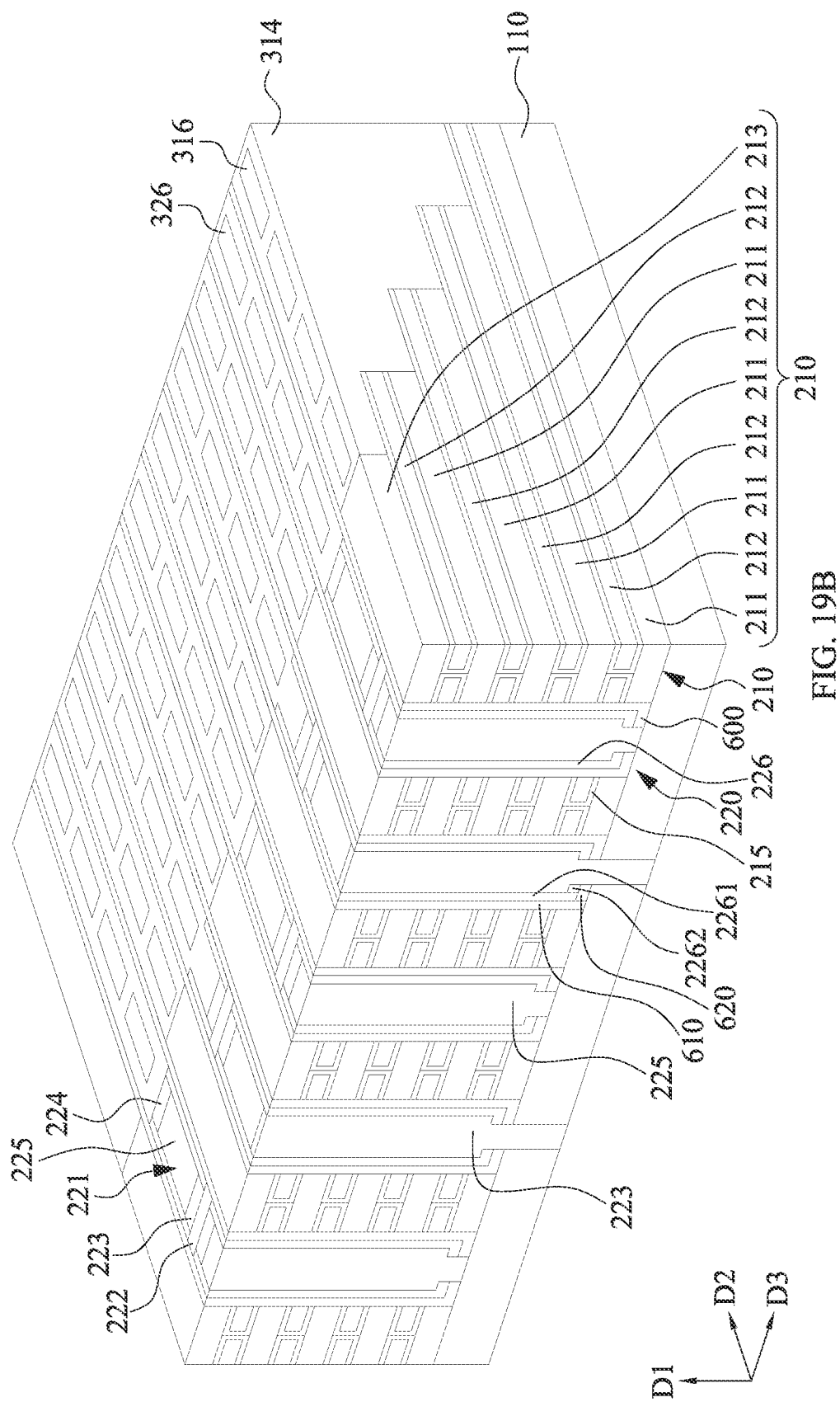
FIG. 19B is a perspective view of a portion of the semiconductor memory structure of FIG. 19A.

At operation 805, with reference to FIGS. 19A and 19B, in the cell array region 200, a plurality of cell strings 221 can be formed by removing portions of the first sacrificial material 920 and portions of the second sacrificial material 940 and filling conductive materials to form first conductive structures 223 and second conductive structures 224 and also filling insulating materials between the first conductive structure 223 and the second conductive structure 224 in each cell string 221 to form a channel isolation structure 225; and a plurality of cell isolation structures 222 can be formed by removing portions of the first sacrificial material 920, portions of the second sacrificial material 940 and portions of semiconductor layers 226 and filling isolation materials, such as an isolation oxide (e.g., $SiO_2$) or other suitable materials, to form cell isolation structures 222. The cell strings 221 are formed between the semiconductor layers 226 and each cell string 221 includes the first conductive structure 223 and the second conductive structure 224, which are separated from the channel isolation structure 225. The first conductive structure 223 and/or the second conductive structure 224 may independently penetrate through the substrate 110 to couple to memory devices 700 (such as, CUA), as shown in FIG. 4A. The cell isolation structures 222 are formed between the ferroelectric layers 600 and also formed between the cell strings 221 to separate the cell strings 221 from each other.

In the connection regions 300, a plurality of first conductive pillars 316 can be formed by removing portions of the dielectric layers 314 and filling conductive materials; and a plurality of second conductive pillar 326 can be formed by removing portions of the first sacrificial material 920 and portions of the second sacrificial material 940 and filling conductive materials. The first conductive pillars 316 extend through the dielectric layers 314 in the first direction D1 until contacting the conductive layers 212, which may be surrounded by the glue layer 215. In some embodiments, the first conductive pillars 316 formed in one row of dielectric layer 314 are arranged along the second direction D2; and the second conductive pillars 326 formed in one row of the first sacrificial material 920 and portions of the second sacrificial material 940 are also arranged along the second direction D2. In some embodiments, the second conductive pillars 326 may be formed by removing not only portions of the first sacrificial material 920 and portions of the second sacrificial material 940, but also portions of the substrate 110, so that the second conductive pillars 326 can penetrate through the substrate 110 to couple to memory devices 700 (such as, CUA), as shown in FIG. 4B. In some embodiments, before forming the first conductive pillars 316 and the second conductive pillars 326, the semiconductor layers 226 in the connection regions 300 may be removed.

Figure 20:
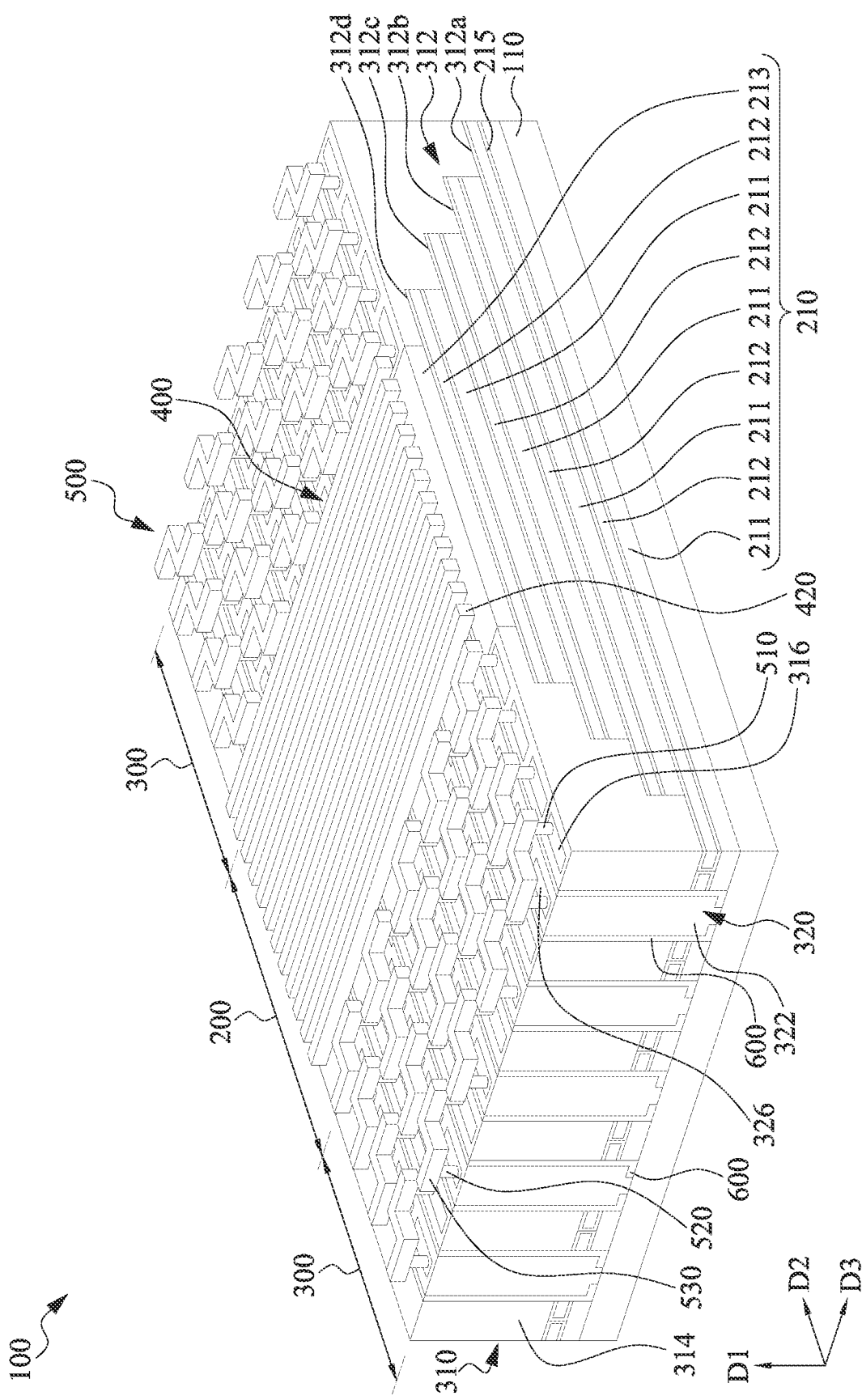

At operation 806, with reference to FIG. 20, a first interconnect structure 400 can be formed on and electrically connect to the cell strings 221 in the cell array region 200 and a second interconnect structure 500 can be formed on and electrically connect to the first and second conductive pillars 316 and 326 in the connection regions 300. In the cell array region 200, a plurality of cell array vias 410 can be formed to couple to first conductive structure 223 and a second conductive structure 224 in the cell strings 221. A plurality of first metal layers 420 can be formed on and coupled to the cell array vias 410 and each first metal layer 420 extends over the cell array region 200 along the third direction D3. It should be noted that the first metal layers 420 and the cell array vias 410 can be formed by dual damascene operations, but the disclosure is not limited thereto.

In the connection regions 300, a plurality of first vias 510 can be formed on and electrically connect to the first conductive pillars 316 and a plurality of second vias 520 can be formed on and electrically connect to the second conductive pillars 326. The first vias 510 and the second vias 520 are arranged in a XY staggered pattern. Due to the staggered vias 510 and 520, one mask can be used to expose these vias 510 and 520 simultaneously, which is a cost efficiency way to manufacture a semiconductor memory structure. A plurality of second metal layer 530 can be formed on and electrically connect to the first vias 510 and the second vias 520. Each second metal layer 530 connects to one of the first vias and one of the second vias 520 and has a non-linear shape, such as a Z shape, an L shape and so on. It should be noted that the second metal layers 530 and the first and second vias 510 and 520 can be formed by dual damascene operations.

In summary, due to the staggered vias 510 and 520, the distance between vias can be increased, which makes it possible to use fewer masks (such as, only one mask) to form all the vias 510 and 520 on the connection region 300. The procedure for forming the interconnect structure 500 for the connection region 300 can be simplified, which saves costs and time.

In some embodiments, a semiconductor memory structure comprises a substrate; a cell array region formed on the substrate; at least one connection region formed on the substrate and beside the cell array region, and comprising at least one staircase portion, comprising: a staircase structure of alternating insulating layers and conductive layers stacking on the substrate along a first direction and extending along a second direction, wherein a length of the conductive layer is greater than a length of the overlying insulating layer and overlying conducive layer, and a portion of an upper surface of each conductive layer is exposed; a dielectric layer formed on the staircase structure to cover the insulating layers and the conductive layers; and a plurality of first conductive pillars formed over the staircase structure and extending into the dielectric layer along the first direction to contact with the upper surfaces of the conductive layers; at least one interval portion formed beside the staircase portion, so that the interval portion and the staircase portion are alternately arranged along a third direction, and each interval portion comprising: an insulation structure; and a plurality of second conductive pillars extending into the insulation structure along the first direction; and at least one ferroelectric layer disposed between the staircase portion and the interval portion; and an interconnect structure formed on the connection region, coupling to the first conductive pillars and the second conductive pillars, and comprising: a plurality of first vias formed on the first conductive pillars and a plurality of second vias formed on the second conductive pillars; and a plurality of metal layers, and each metal layer connecting to one of the first vias formed on one of the first conductive pillars in one staircase portion and one the second via formed on the second conductive pillar in an adjacent interval portion, wherein the first vias on the first conductive pillars and the second vias the second conductive pillars are arranged in a XY staggered pattern; and wherein each metal layer has a non-linear shape.

In some embodiments, a semiconductor memory structure comprises a substrate; a cell array region formed on the substrate and comprising a plurality of cell strings including source structures and drain structures; at least one connection region formed on the substrate and beside the cell array region, and comprising: a plurality of rows of first conductive pillars formed over the substrate, wherein each of the first conductive pillars extends along a first direction, and each row of the first conductive pillars are arranged in a second direction; a plurality of rows of second conductive pillars formed over the substrate, wherein each of the second conductive pillars extends along the first direction, and each row of the second conductive pillars are arranged in the second direction, and wherein the rows of the first conductive pillars and the rows of the second conductive pillars are alternately arranged along a third direction; and a ferroelectric layer disposed between the rows of first conductive pillars 316 and the rows of second conductive pillars; a first interconnect structure formed on the cell array region and connecting to the source structures and the drain structures of the cell strings; and a second interconnect structure formed on the connection region, coupling to the first conductive pillars and the second conductive pillars, and comprising a plurality of vias formed on the first conductive pillars and the second conductive pillars to allow one of the first conductive pillars and one of the second conductive pillars connect to one via, wherein the vias on the first conductive pillars and the second conductive pillars are arranged in a XY staggered pattern.

In some embodiments, a method of manufacturing a semiconductor memory structure comprises forming a stack of alternating insulating layers and sacrificial layers over a substrate; forming trenches in the stack; replacing the sacrificial layers with conductive layers; filling each trench with a multi-layered structure including a ferroelectric layer and a semiconductor layer; removing portions of the multi-layered structure to form a plurality of cell strings in a cell array region and to form a plurality of conductive pillars in connection regions; and forming a first interconnect structure to connect to the cell strings in the cell array region and forming a second interconnect structure to connect to the conductive pillars in the connection regions, wherein forming the second interconnect structure comprises forming vias in a XY staggered pattern on the conductive pillars.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A semiconductor memory structure, comprising:
   a substrate;
   a cell array region formed on the substrate;
   at least one connection region formed on the substrate and beside the cell array region, and comprising:
      at least one staircase portion, comprising:
         a staircase structure of alternating insulating layers and conductive layers stacking on the substrate along a first direction and extending along a second direction, wherein a length of the conductive layer is greater than a length of the overlying insulating layer and overlying conducive layer, and a portion of an upper surface of each conductive layer is exposed;
         a dielectric layer formed on the staircase structure to cover the insulating layers and the conductive layers; and
         a plurality of first conductive pillars formed over the staircase structure and extending into the dielectric layer along the first direction to contact with the upper surfaces of the conductive layers;
      at least one interval portion formed beside the staircase portion, so that the interval portion and the staircase portion are alternately arranged along a third direction, and each interval portion comprising:
         an insulation structure; and
         a plurality of second conductive pillars extending into the insulation structure along the first direction; and
      at least one ferroelectric layer disposed between the staircase portion and the interval portion; and
   an interconnect structure formed on the connection region, coupling to the first conductive pillars and the second conductive pillars, and comprising:
      a plurality of first vias formed on the first conductive pillars and a plurality of second vias formed on the second conductive pillars; and
      a plurality of metal layers, and each metal layer connecting to one of the first vias formed on one of the first conductive pillars in one staircase portion and one the second via formed on the second conductive pillar in an adjacent interval portion,
   wherein the first vias on the first conductive pillars and the second vias the second conductive pillars are arranged in a XY staggered pattern; and
   wherein each metal layer has a non-linear shape.

2. The semiconductor memory structure of claim 1, wherein the first conductive pillars and the second conductive pillars are arranged in a XY staggered pattern, corresponding to the XY staggered pattern of the first vias and the second vias.

3. The semiconductor memory structure of claim 1, wherein each first conductive pillar has a longitudinal top surface and each second conductive pillar has a longitudinal top surface; wherein the first vias are formed on a first end of the longitudinal top surfaces of the first conductive pillar; and the second vias are formed on a second end of the longitudinal top surfaces of the second conductive pillar; and wherein the first end and the second end are arranged in a XY staggered pattern.

4. The semiconductor memory structure of claim 3, wherein the metal layer comprises:
   a first part connecting to the first via on the first conductive pillar in one staircase portion and extending along the third direction;
   a second part connecting to the second via on the second conductive pillar in the adjacent interval portion and along the third direction, so that the second part and the first part extend toward each other; and
   a connection part connecting the first part with the second part.

5. The semiconductor memory structure of claim 4, wherein the first part has a longitudinal shape extending along the third direction, the second part has a longitudinal shape extending along the third direction, and the connection part has a longitudinal shape extending along the second direction.

6. The semiconductor memory structure of claim 3, wherein the metal layer comprises:
   a first part connecting to the first via on the first conductive pillar in one staircase portion and extending along the second direction;
   a second part connecting to the second via on the second conductive pillar in an adjacent interval portion and extending along the second direction, so that the second part and the first part are parallel with each other; and
   a connection part connecting the first part with the second part.

7. The semiconductor memory structure of claim 6, wherein the first part has a longitudinal shape extending along the second direction, the second part has a longitudinal shape extending along the second direction, and the connection part has a longitudinal shape extending along the third direction.

8. The semiconductor memory structure of claim 3, wherein the metal layer comprises:
   a first part connecting to the first via on the first conductive pillar in one staircase portion and extending along the second direction; and
   a second part connecting to the second via on the second conductive pillar in an adjacent interval portion and extending along the third direction, so that the second part connects to the first part.

9. The semiconductor memory structure of claim 3, wherein the metal layer comprises:
   a first part connecting to the first via on the first conductive pillar in one staircase portion and extending along the third direction; and
   a second part connecting to the second via on the second conductive pillar in the adjacent interval portion and extending along the second direction, so that the second part connects to the first part.

10. The semiconductor memory structure of claim 1, wherein each conductive layer separates into two sublayers by glue layers, wherein the glue layer separates the conductive layer from adjacent insulating layers.

11. A semiconductor memory structure, comprising:
    a substrate;
    a cell array region formed on the substrate and comprising a plurality of cell strings including source structures and drain structures;
    at least one connection region formed on the substrate and beside the cell array region, and comprising:
       a plurality of rows of first conductive pillars formed over the substrate, wherein each of the first conductive pillars extends along a first direction, and each row of the first conductive pillars are arranged in a second direction;
       a plurality of rows of second conductive pillars formed over the substrate, wherein each of the second conductive pillars extends along the first direction, and each row of the second conductive pillars are arranged in the second direction, and wherein the rows of the first conductive pillars and the rows of the second conductive pillars are alternately arranged along a third direction; and
       a ferroelectric layer disposed between the rows of first conductive pillars and the rows of second conductive pillars:
    a first interconnect structure formed on the cell array region and connecting to the source structures and the drain structures of the cell strings; and
    a second interconnect structure formed on the connection region, coupling to the first conductive pillars and the second conductive pillars, and comprising a plurality of vias formed on the first conductive pillars and the second conductive pillars to allow one of the first conductive pillars and one of the second conductive pillars connect to one via,
    wherein the vias on the first conductive pillars and the second conductive pillars are arranged in a XY staggered pattern.

12. The semiconductor memory structure of claim 11, wherein the first conductive pillars and the second conductive pillars are arranged in a XY staggered pattern, corresponding to the XY staggered pattern of the vias.

13. The semiconductor memory structure of claim 11, wherein each first conductive pillar has a longitudinal top surface and each second conductive pillar has a longitudinal top surface; wherein the vias formed on the first conductive pillars are formed on a first end of the longitudinal top surfaces of the first conductive pillar; and the vias formed on the second conductive pillars are formed on a second end of the longitudinal top surfaces of the second conductive pillar; and wherein the first end and the second end are arranged in a XY staggered pattern.

14. The semiconductor memory structure of claim 11, wherein the second interconnect structure further comprises a plurality of metal layers and each metal layer connects to one via formed on the first conductive pillar and one via formed on the second conductive pillar.

15. The semiconductor memory structure of claim 14, wherein the metal layer has a Z shape or an L shape.

16. The semiconductor memory structure of claim 11, wherein the second conductive pillars penetrate through the substrate.

17. The semiconductor memory structure of claim 11, wherein the ferroelectric layer has an L-shaped vertical cross section.

18. A method of manufacturing a semiconductor memory structure, the method comprising:
    forming a stack of alternating insulating layers and sacrificial layers over a substrate;
    forming trenches in the stack;
    replacing the sacrificial layers with conductive layers;
    filling each trench with a multi-layered structure including a ferroelectric layer and a semiconductor layer;
    removing portions of the multi-layered structure to form a plurality of cell strings in a cell array region and to form a plurality of conductive pillars in connection regions; and
    forming a first interconnect structure to connect to the cell strings in the cell array region and forming a second interconnect structure to connect to the conductive pillars in the connection regions,
    wherein forming the second interconnect structure comprises forming vias in a XY staggered pattern on the conductive pillars.

19. The method of claim 18, wherein each conductive pillar is a circular cylinder; and the conductive pillars are arranged in a XY staggered pattern, corresponding to the XY staggered pattern of the vias.

20. The method of claim 18, wherein forming the second interconnect structure further comprises forming a plurality of metal layers on the vias, and wherein each metal layer has a non-linear shape.

* * * * *